United States Patent
In et al.

(10) Patent No.: US 12,073,791 B2
(45) Date of Patent: Aug. 27, 2024

(54) EMISSION CONTROL DRIVER INCLUDING A STAGE THAT SETS A GATE CONTROL SIGNAL AT DIFFERENT TIMES TO A FIRST VOLTAGE AND A SECOND VOLTAGE

(71) Applicant: Samsung Display Co., Ltd., Yongin-Si (KR)

(72) Inventors: Haijung In, Yongin-si (KR); Chulkyu Kang, Yongin-si (KR); Soongi Kwon, Yongin-si (KR); Minjeong Kim, Yongin-si (KR); Kimyeong Eom, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 17/748,926

(22) Filed: May 19, 2022

(65) Prior Publication Data

US 2023/0140806 A1     May 4, 2023

(30) Foreign Application Priority Data

Nov. 3, 2021 (KR) .................... 10-2021-0149948

(51) Int. Cl.
    *G09G 3/3258*     (2016.01)
(52) U.S. Cl.
    CPC ... *G09G 3/3258* (2013.01); *G09G 2300/0426* (2013.01); *G09G 2310/08* (2013.01)
(58) Field of Classification Search
    CPC .............................................. G09G 2310/08
    See application file for complete search history.

(56) References Cited

U.S. PATENT DOCUMENTS

| 10,403,208 | B2 | 9/2019 | Kwon et al. | |
|---|---|---|---|---|
| 2013/0222352 | A1* | 8/2013 | Jeong | G11C 19/184 345/205 |
| 2016/0210906 | A1* | 7/2016 | In | G09G 3/3233 |
| 2016/0314737 | A1* | 10/2016 | Park | G09G 3/3677 |
| 2017/0018245 | A1* | 1/2017 | Park | G09G 3/3677 |
| 2017/0116920 | A1* | 4/2017 | Kwon | G09G 3/3266 |
| 2017/0287395 | A1* | 10/2017 | Jang | H03K 17/687 |
| 2017/0345366 | A1* | 11/2017 | Jang | G09G 3/3225 |
| 2019/0213939 | A1* | 7/2019 | Wu | G09G 3/20 |

(Continued)

FOREIGN PATENT DOCUMENTS

| KR | 10-2017-0048630 A | 5/2017 |
|---|---|---|
| KR | 10-2019-0141781 A | 12/2019 |

(Continued)

*Primary Examiner* — Kirk W Hermann
(74) *Attorney, Agent, or Firm* — Innovation Counsel LLP

(57) ABSTRACT

A driver includes a stage that includes a first controller, a second controller, and a first output unit. The first controller controls a voltage level of a first node. The second controller controls voltage levels of a second node and a third node to be equal to the voltage level of a first node or an opposite voltage level of the voltage level of the first node, and controls a voltage level of a fifth node to be equal to the opposite voltage level of the voltage level of the first node. The first output unit may output a gate control signal, which has a first voltage when the second node and the third node is in an on-voltage level state, and has a second voltage when the fifth node is in an on-voltage level state.

20 Claims, 12 Drawing Sheets

(56) References Cited

U.S. PATENT DOCUMENTS

| | | |
|---|---|---|
| 2019/0287446 A1* | 9/2019 | Liao .................... G11C 19/28 |
| 2021/0035489 A1 | 2/2021 | Seo et al. |
| 2021/0074215 A1 | 3/2021 | Park et al. |

FOREIGN PATENT DOCUMENTS

| | | |
|---|---|---|
| KR | 10-2021-0014258 A | 2/2021 |
| KR | 10-2021-0029336 A | 3/2021 |

\* cited by examiner

EMISSION CONTROL DRIVER INCLUDING A STAGE THAT SETS A GATE CONTROL SIGNAL AT DIFFERENT TIMES TO A FIRST VOLTAGE AND A SECOND VOLTAGE

CROSS-REFERENCE TO RELATED APPLICATION

This application claims priority under 35 U.S.C. § 119 to Korean Patent Application No. 10-2021-0149948 filed on Nov. 3, 2021 in the Korean Intellectual Property Office; the Korean Patent Application is incorporated by reference.

BACKGROUND

1. Field

The technical field is related to an emission control driver configured to output emission control signals and is related to a display apparatus including the emission control driver.

2. Description of the Related Art

A display apparatus may include pixels, scan lines, emission control lines, a scan driver, an emission control driver, a data driver, and a controller. The scan lines and the emission control lines are connected to the pixels. The scan driver includes stages connected to scan lines for supplying scan signals to the scan lines according to signals received from the controller. The emission control driver includes stages connected to emission control lines for supplying emission control signals to the emission control lines according to signals received from the controller.

SUMMARY

One or more embodiments may be related to an emission control driver that may stably output emission control signals. One or more embodiments may be related to a display apparatus including the emission control driver.

According to one or more embodiments, a driver includes a plurality of stages, wherein each of the plurality of stages includes a first node controller configured to control a voltage of a first node based on a start signal and a first clock signal, a second node controller configured to control, in turns, voltage levels of a second node and a third node to be equal to a voltage level of the first node or an opposite voltage level of the voltage level of the first node based on a second clock signal and the voltage of the first node, and further configured to control a voltage of a fifth node to be equal to the opposite voltage level of the voltage level of the first node, and a first output unit configured to output a gate control signal based on a first voltage of an on-voltage level input according to the voltages of the second node and the third node, and a second voltage of an off-voltage level input according to the voltage of the fifth node.

Each of the plurality of stages may further include a second output unit configured to generate and output carry signals based on the first voltage of the on-voltage level input according to the voltages of the second node and the third node and a third voltage of the off-voltage level input according to the voltage of the fifth node, wherein the third voltage may be less than the second voltage.

A start signal of a first stage of the plurality of stages may be a signal input from outside, and start signals of other stages except the first stage may be previous carry signals input from previous stages, respectively.

The second node and the third node may enter an on-voltage level state in turns on a basis of n times or 1/n times of a frame, wherein the first output unit may be configured to output the first voltage when a transistor connected to the second node or the third node in the on-voltage level state is turned on, and wherein the second output unit may be configured to output the first voltage when a transistor connected to the second node or the third node in the high-level state is turned on.

The second clock signal may be a signal in which a phase of the first clock signal is shifted by a preset time.

A length of an off-voltage level of the start signal may be greater than a period of the first clock signal and the second clock signal.

A timing at which an off-voltage level of the gate control signal starts may be delayed by a preset time from a timing at which an off-voltage level of the start signal starts.

A length of an off-voltage level of the gate control signal may be equal to a length of an off-voltage level of the start signal.

The first node controller may include a first transistor connected between an input terminal configured to receive the start signal and the first node, wherein a gate terminal thereof may be connected to a first clock terminal configured to receive the first clock signal, a third transistor connected between the first clock terminal and the fourth node, and wherein a gate terminal thereof may be connected to the first node, and a fourth transistor connected between a first power input terminal to which the first voltage is input and the fourth node, wherein a gate terminal thereof may be connected to the first clock terminal.

The second node controller may include a (2-1)st node controller configured to control the second node or the third node to have a voltage level equal to the voltage level of the first node with an interval of n times or 1/n times of a frame, and a (2-2)nd node controller configured to control the fifth node to have an inverted voltage level of the voltage level of the first node.

The (2-1)st node controller may include a 14th transistor connected between the first node and the second node, wherein a gate terminal thereof may be connected to a fourth power input terminal configured to supply a fourth voltage, a 15th transistor connected between the first node and the third node, wherein a gate terminal thereof may be connected to a fifth power input terminal configured to supply a fifth voltage of an inverted voltage level of a voltage level of the fourth voltage, a 12th transistor connected between the third node and a 13th transistor, wherein a gate terminal thereof is connected to a first power input terminal to which the first voltage is input, the 13th transistor connected between the 12th transistor and a third power input terminal configured to supply a third voltage, wherein a gate terminal thereof is connected to the fourth power input terminal, a 9th transistor connected between the second node and a 10th transistor, wherein a gate terminal thereof is connected to the first power input terminal, a 10th transistor connected between the 9th transistor and the third power input terminal, wherein a gate terminal thereof is connected to the fifth power input terminal, and a boost capacitor connected between the first power input terminal and a second output terminal configured to output carry signals.

The (2-2)nd node controller may include a 5th transistor connected between the fourth node and a first terminal of a first capacitor, wherein a gate terminal thereof is connected to a first power input terminal to which the first voltage is input, a 6th transistor connected between a second terminal of the first capacitor and a second clock terminal configured to receive the second clock signal, wherein a gate terminal thereof is connected to the first terminal of the first capacitor, a 7th transistor connected between the second terminal of the first capacitor and the fifth node, wherein a gate terminal thereof is connected to the second clock terminal, an 8th transistor connected between the second clock terminal and a first terminal of a second capacitor, wherein a gate terminal thereof is connected to a second terminal of the second capacitor and the second node, a 11th transistor connected between the second clock terminal and a first terminal of the third capacitor, wherein a gate terminal thereof is connected to a second terminal of the third capacitor and the third node, a 23rd transistor connected between the first terminal of the second capacitor and a second power input terminal configured to supply the second power, wherein a gate terminal thereof is connected to the fourth node, a 24th transistor connected between the first terminal of the third capacitor and the second power input terminal, wherein a gate terminal thereof is connected to the fourth node, and a 25th transistor connected between the fifth node and a third power input terminal, wherein a gate terminal thereof is connected to the first node.

The second node controller may further include a fifth capacitor connected between the fifth node and the third power input terminal.

The second node controller may further include a sixth capacitor connected between the fifth node and the second power input terminal.

The second node controller may further include a fifth capacitor connected between the fifth node and the second power input terminal.

The second output unit may include a 16th transistor connected between a first power input terminal to which the first voltage is input and a second output terminal configured to output the carry signal, wherein a gate terminal thereof is connected to the second node, a 17th transistor connected between the first power input terminal and the second output terminal, wherein a gate terminal thereof is connected to the third node, and an 18th transistor connected between a third power input terminal to which the third voltage is input and the second output terminal, wherein a gate terminal thereof is connected to the fifth node.

The first output unit may include a 19th transistor connected between a first power input terminal to which the first voltage is input and a first output terminal configured to output the gate control signal, wherein a gate terminal thereof is connected to the second node, a 20th transistor connected between the first power input terminal and the first output terminal, wherein a gate terminal thereof is connected to the third node, and a 21st transistor connected between a second power input terminal to which the second voltage is input and the first output terminal, wherein a gate terminal thereof is connected to the fifth node.

The driver may further include a second transistor connected between the first node and a second power input terminal to which the second voltage, wherein a gate terminal thereof is connected to a reset terminal that supplies reset signals.

The driver may further include a 22nd transistor of which a gate terminal is connected to the first node, and which is configured to block a leakage current of transistors to the first node while the first node is in an on-voltage level state, wherein the transistors are connected to the first node.

Each of the transistors connected to the first node may include a pair of transistors connected to each other in series, and whose gate terminals receive a same signal, wherein the 22nd transistor may be connected between an intermediate node of the pair of transistors and a first power input terminal configured to supply the first voltage.

An embodiment may be related to a driver. The driver includes a stage. The stage includes an input terminal configured to receive a start signal; a first power input terminal, a second power input terminal, a first clock terminal, a second clock terminal, a first node, a second node, a third node, a fourth node, a fifth node, a first controller, a second controller, a first output terminal, and a first output unit. The first power input terminal may receive a first voltage of an on-voltage level. The second power input terminal may receive a second voltage of an off-voltage level. The first clock terminal may receive a first clock signal. The second clock terminal may receive a second clock signal. The first node, the second node, the third node, the fourth node, and the fifth node may be spaced from each other. The first controller may control a voltage of the first node based on a start signal and the first clock signal. The second controller may control each of voltage levels of the second node and a third node to be equal to a voltage level of the first node or an opposite voltage level of the voltage level of the first node based on the second clock signal and the voltage of the first node, and may control a voltage level of a fifth node to be equal to the opposite voltage level of the voltage level of the first node. The first output unit may output a gate control signal to the first output terminal. The gate control signal may have the first voltage when at least one of the second node and the third node is in an on-voltage level state. The gate control signal may have the second voltage when the fifth node is in an on-voltage level state.

The stage may include a third power input terminal configured to receive a third voltage of the off-voltage level, a second output terminal, and a second output unit configured to output a carry signal to the second output terminal. The carry signal may have the first voltage when at least one of the second node and the third node is in the on-voltage level state. The carry signal may have the third voltage when the fifth node is in the off-voltage level state. The third voltage may be less than the second voltage.

The stage may receive the start signal from a device external to the driver or from a previous stage included in the driver.

The second node and the third node may sequentially enter the on-voltage level state based on a multiple or fraction of a frame. The first output unit may comprise a first pull-up transistor and a second pull-up transistor. Each of the first pull-up transistor and the second pull-up transistor may be electrically connected between the first output terminal and the first power input terminal. A gate terminal of the first pull-up transistor may be connected to the second node, and a gate terminal of the second pull-up transistor may be connected to the third node. The second output unit may comprise a third pull-up transistor and a fourth pull-up transistor. Each of the third pull-up transistor and the fourth pull-up transistor may be electrically connected between the second output terminal and the first power input terminal. A gate terminal of the third pull-up transistor may be connected to the second node, and a gate terminal of the fourth pull-up transistor may be connected to the third node.

The second clock signal may be a phase-shifted version of the first clock signal. A phase difference between the first clock signal and the second clock signal may be preset.

An off-voltage level period of the start signal may be longer than each of a period of the first clock signal and a period the second clock signal.

A start of an off-voltage level period of the gate control signal may be delayed by a preset time from a start of an off-voltage level period of the start signal.

A length of the off-voltage level period of the gate control signal may be equal to a length of the off-voltage level period of the start signal.

The first controller may include the following elements: a first transistor electrically connected between the input terminal and the first node, wherein a gate terminal of the first transistor may be electrically connected to the first clock terminal; a third transistor electrically connected between the first clock terminal and the fourth node, wherein a gate terminal of the third transistor may be electrically connected to the first node; and a fourth transistor electrically connected between the first power input and the fourth node, wherein a gate terminal of the fourth transistor may be electrically connected to the first clock terminal.

The second controller may include the following elements: a first sub-controller configured to control the voltage levels of the second node or the third node to be equal to the voltage level of the first node with an interval of a multiple or fraction of a frame; and a second sub-controller configured to control the voltage level of the fifth node to be equal to the opposite voltage level of the voltage level of the first node.

The stage may include the following elements: a second output terminal configured to output a carry signal; a third power input terminal configured to receive a third voltage less than the second voltage; a fourth power input terminal configured to receive a fourth voltage; and a fifth power input terminal configured to receive a fifth voltage. A voltage level of the fifth voltage may be an opposite voltage level of a voltage level of the fourth voltage. The first sub-controller may include the following elements: a 14th transistor electrically connected between the first node and the second node, wherein a gate terminal of the 14th transistor may be electrically connected to the fourth power input terminal; a 15th transistor electrically connected between the first node and the third node, wherein a gate terminal of the 15th transistor may be electrically connected to the fifth power input terminal; a 12th transistor electrically connected between the third node and a 13th transistor, wherein a gate terminal of the 12th transistor may be electrically connected to the first power input terminal; the 13th transistor electrically connected between the 12th transistor and the third power input terminal, wherein a gate terminal of the 13th transistor may be connected to the fourth power input terminal; a 9th transistor electrically connected between the second node and a 10th transistor, wherein a gate terminal of the 9th transistor may be electrically connected to the first power input terminal; the 10th transistor electrically connected between the 9th transistor and the third power input terminal, wherein a gate terminal of the 10th transistor may be electrically connected to the fifth power input terminal; and a boost capacitor electrically connected between the first power input terminal and the second output terminal.

The stage may include the following elements: a third power input terminal configured to receive a third voltage less than the second voltage; and a first capacitor, a second capacitor, and a third capacitor spaced from each other. The second sub-controller may include the following elements: a 5th transistor electrically connected between the fourth node and a first terminal of the first capacitor, wherein a gate terminal of the 5th transistor may be electrically connected to the first power input terminal; a 6th transistor electrically connected between a second terminal of the first capacitor and the second clock terminal, wherein a gate terminal of the 6th transistor may be electrically connected to the first terminal of the first capacitor; a 7th transistor electrically connected between the second terminal of the first capacitor and the fifth node, wherein a gate terminal of the 7th transistor may be electrically connected to the second clock terminal; an 8th transistor electrically connected between the second clock terminal and a first terminal of the second capacitor, wherein a gate terminal of the 8th transistor may be electrically connected to a second terminal of the second capacitor and the second node; a 11th transistor electrically connected between the second clock terminal and a first terminal of the third capacitor, wherein a gate terminal of the 11th transistor may be electrically connected to a second terminal of the third capacitor and the third node; a 23rd transistor electrically connected between the first terminal of the second capacitor and the second power input terminal, wherein a gate terminal of the 23rd transistor may be electrically connected to the fourth node; a 24th transistor electrically connected between the first terminal of the third capacitor and the second power input terminal, wherein a gate terminal of the 24th transistor may be electrically connected to the fourth node; and a 25th transistor electrically connected between the fifth node and the third power input terminal, wherein a gate terminal of the 25th transistor may be electrically connected to the first node.

The stage may include a fifth capacitor electrically connected between the fifth node and the third power input terminal.

The stage may include a sixth capacitor electrically connected between the fifth node and the second power input terminal.

The stage may include a fifth capacitor electrically connected between the fifth node and the second power input terminal.

The second output unit may include the following elements: a 16th transistor electrically connected between the first power input terminal and the second output terminal, wherein a gate terminal of the 16th transistor may be electrically connected to the second node; a 17th transistor electrically connected between the first power input terminal and the second output terminal, wherein a gate terminal of the 17th transistor may be electrically connected to the third node; and an 18th transistor electrically connected between the third power input terminal and the second output terminal, wherein a gate terminal of the 18th transistor may be electrically connected to the fifth node.

The first output unit may include the following elements: a 19th transistor electrically connected between the first power input terminal and the first output terminal, wherein a gate terminal of the 19th transistor may be electrically connected to the second node; a 20th transistor electrically connected between the first power input terminal and the first output terminal, wherein a gate terminal of the 20th transistor may be electrically connected to the third node; and a 21st transistor electrically connected between the second power input terminal and the first output terminal, wherein a gate terminal of the 21st transistor may be electrically connected to the fifth node.

The stage may include the following elements: a reset terminal configured to receive a reset signal; and a second transistor electrically connected between the first node and the second power input terminal, wherein a gate terminal of the second transistor may be electrically connected to the reset terminal.

The first transistor in the first controller may include a first sub transistor and a second sub transistor which are electrically connected to each other in series. The stage may include a 22nd transistor electrically connected between the first power input terminal and an intermediate node of the first sub transistor and the second sub transistor of the first transistor. A gate terminal of the 22nd transistor may be electrically connected to the first node.

Each of the 14th transistor and the 15th transistor in the first sub-controller may include a first sub transistor and a second sub transistor which are electrically connected to each other in series. The stage may include a 22nd transistor electrically connected between the first power input terminal and intermediate nodes of the first sub transistor and the second sub transistor of each of the 14th transistor and the 15th transistor. A gate terminal of the 22nd transistor may be electrically connected to the first node.

DETAILED DESCRIPTION

Figure 1:
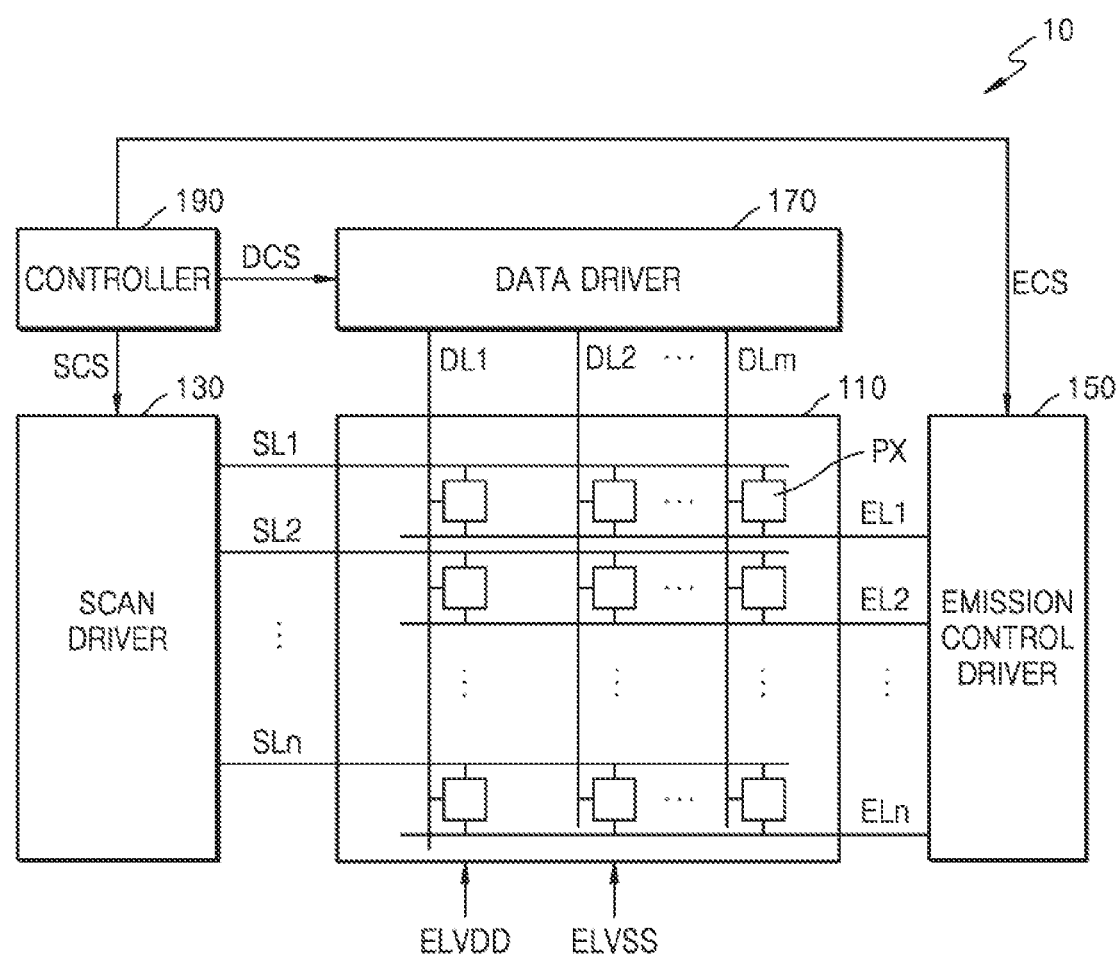
FIG. 1 is a diagram illustrating a display apparatus according to an embodiment.

Examples of embodiments are described with reference to the accompanying drawings, wherein like reference numerals may refer to like elements. Practical embodiments may have different forms and should not be construed as being limited to the described embodiments.

Although the terms "first," "second," etc. may be used to describe various elements, the elements should not be limited by the terms. The terms may be used to distinguish one element from another. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-category (or first-set)," "second-category (or second-set)," etc., respectively.

The singular forms "a," "an," and "the" may indicate the plural forms as well, unless the context clearly indicates otherwise.

The terms "comprise," "comprising," "include" and/or "including" may specify the presence of stated features or elements but may not preclude the addition of one or more other features or elements.

When a first element is referred to as being "on" a second element, the first element can be directly or indirectly on the second element. Zero, one, or more intervening elements may be present between the first element and the second element.

Dimensions of elements in the drawings may be exaggerated or reduced for convenience of explanation and may not limit the embodiments.

The expression "A and/or B" may mean "at least one of A and B."

The term "connect" may mean "directly connect" or "indirectly connect." The term "connect" may mean "mechanically connect" and/or "electrically connect." The term "connected" may mean "electrically connected" or "electrically connected through no intervening transistor." The term "insulate" may mean "electrically insulate" or "electrically isolate." The term "conductive" may mean "electrically conductive." The term "drive" may mean "operate" or "control." The term "transistor" may mean "transistor set." The term "(u-v)th transistor" may mean "u-th set v-th sub-transistor." The term "section" may mean "session" or "period."

The expression that X and Y are electrically connected may mean that at least one device (e.g., a switch, a transistor, a capacitance element, an inductor, a resistance element, a diode, etc.) that enables electrical connection of X and Y is connected between X and Y. The expression that Z is electrically connected between X and Y may mean that a first terminal of Z is electrically connected (through no intervening transistors) to X and that a second terminal of Z is electrically connected (through no intervening transistors) to Y.

"ON" or "on" used in association with an element state may denote an activated (turned-on) state of an element; "OFF" may denote an inactivated (turned-off) state of an element. "ON" used in association with a signal received by an element may denote a signal for activating the element; "OFF" may denote a signal for inactivating the element. An element may be activated by a high-level voltage or a low-level voltage. A P-type transistor is activated by a low-level voltage, and an N-type transistor is activated by a high-level voltage. Therefore, an "ON" voltage for a P-type transistor and an "ON" voltage for an N-type transistor may have opposite (high versus low) voltage levels. A voltage level that activates a transistor is referred to as an ON-voltage level, on-voltage level, on-voltage, or on voltage, and a voltage level that inactivates a transistor is referred to as an OFF-voltage level, off-voltage level, off-voltage, or off voltage.

FIG. 1 is a diagram illustrating a display apparatus 10 according to an embodiment.

The display apparatus 10 may be (included in) an electronic apparatus, such as a smartphone, a mobile phone, a smartwatch, a navigation apparatus, a game console, a television (TV), a head unit for an automobile, a notebook computer, a laptop computer, a tablet computer, a personal multimedia player (PMP), or a personal digital assistant (PDA). The display apparatus 10 and/or the electronic apparatus may be flexible.

Referring to FIG. 1, the display apparatus 10 may include a display part 110, a scan driver 130, an emission control driver 150, a data driver 170, and a controller 190.

Pixels PX and signal lines that may apply electrical signals to the pixels PX may be arranged in the display part 110.

The pixels PX may be arranged in a first direction (a row direction) and a second direction (a column direction). The pixels PX may be arranged in a stripe configuration, a PENTILE™ configuration, or a mosaic configuration for displaying images. Each of the pixels PX may include an organic light-emitting diode as a display element, and the organic light-emitting diode may be connected to a pixel circuit. The pixel circuit may include transistors and at least one capacitor.

The transistors may be N-type oxide thin-film transistors. The oxide thin-film transistors may be low temperature polycrystalline oxide (LTPO) thin-film transistors. One or more of the transistors may be P-type transistors. An active pattern (a semiconductor layer) of a transistor may include an inorganic semiconductor (e.g., amorphous silicon or polycrystalline silicon) or an organic semiconductor.

The signal lines may include scan lines SL1, SL2, to SLn that extend in the first direction; emission control lines EL1, EL2, to ELn that extend in the first direction; and data lines DL1, DL2, to DLm that extend in the second direction. The scan lines SL1 to SLn may be apart from each other in the second direction and configured to transfer scan signals to the pixels PX. The emission control lines EL1 to ELn may be spaced from each other in the second direction and configured to transfer emission control signals to the pixels PX. The data lines DL1 to DLm may be spaced from each other in the first direction and configured to transfer data signals to the pixels PX. Each of the pixels PX may be connected to at least one corresponding scan line among the scan lines SL1 to SLn, a corresponding emission control line among the emission control lines EL1 to ELn, and a corresponding data line among the data lines DL1 to DLm.

The scan driver (a first gate control driver) 130 may be connected to the scan lines SL1 to SLn, may generate scan signals according to a scan driving control signal SCS from the controller 170, and may sequentially supply the scan signals to the scan lines SL1 to SLn. A scan signal may be a square wave signal and may include repetitions of an on-voltage (for turning on a transistor of a pixel PX) and an off-voltage (for turning off the transistor). An on-voltage may be a high-level voltage. A scan signal may have an off-voltage level and a pulse waveform that periodically transitions to an on-voltage level from the off-voltage level. The scan driver 130 may include a shift register (or a stage) that sequentially generates and outputs scan signals of a pulse shape corresponding to a start signal of a pulse shape using clock signals.

The emission control driver (a second gate control driver) 150 may be connected to the emission control lines EL1 to ELn, may generate emission control signals according to an emission driving control signal ECS from the controller 170, and may sequentially supply the emission control signals to the scan lines SL1 to SLn. An emission control signal may be a square wave signal and may include repetitions of an on-voltage (for turning on a transistor of a pixel PX) and an off-voltage (for turning off the transistor). An on-voltage may be a high-level voltage. An emission control signal may have an on-voltage level and a pulse waveform that periodically transitions to an off-voltage level from the on-voltage level. An emission control signal may have pulses that periodically have an off-voltage level. The emission control driver 150 may include a shift register (or a stage) that sequentially generates and outputs emission control signals of a pulse shape corresponding to a start signal of a pulse shape using clock signals.

The emission control driver 150 may sequentially output emission control signals of an on-voltage to the emission control lines EL1 to ELn until a preset portion of one frame time, may sequentially output emission control signals of an off-voltage to the emission control lines EL1 to ELn during the preset portion of one frame time, and may sequentially output emission control signals of an on-voltage to the emission control lines EL1 to ELn after the preset portion. When an emission control signal of an off-voltage is supplied to the pixel PX, the pixel PX may receive a data signal in response to a scan signal, and/or may compensate for a threshold voltage of a driving transistor. When an emission control signal of an on-voltage is supplied to the pixel PX, the pixel PX may emit light at brightness that corresponds to a data signal.

The data driver 170 may be connected to the data lines DL1 to DLm and may supply data signals to the data lines DL1 to DLm according to a data driving control signal DCS from the controller 190. The data signals may be supplied to the pixels PX to which scan signals are supplied. The data driver 170 may supply data signals to the data lines DL1 to DLm in synchronization with the scan signals.

The display apparatus may be an organic field light-emitting apparatus, and a first power voltage ELVDD and a second power voltage ELVSS may be supplied to the pixels PX of the display part 110. The first power voltage ELVDD may be a high-level voltage provided to a first electrode (a pixel electrode or an anode) of the organic light-emitting diode of each pixel PX. The second power voltage ELVSS may be a low-level voltage provided to a second electrode (an opposite electrode or a cathode) of the organic light-emitting diode. The first power voltage ELVDD and the second power voltage ELVSS are enable the pixels PX to emit light.

The controller 190 may generate a scan driving control signal SCS, an emission driving control signal ECS, and a data driving control signal DCS based on signals received from an external device. The controller 190 may supply the scan driving control signal SCS to the scan driver 130, may supply the emission driving control signal ECS to the emission control driver 150, and may supply the data driving control signal DCS to the data driver 170.

FIG. 1 illustrates that the emission control driver 150 is external to the scan driver 130 in the display apparatus 10. The emission control driver 150 may be implemented inside the scan driver 130.

A scan line and an emission control line may be electrically connected to a same pixel PX. A transistor of the pixel PX controlled by a signal supplied by the scan line may be different from a transistor of the pixel PX controlled by a signal supplied by the emission control line. The scan line and the emission control line may be respectively connected to gate electrodes of corresponding transistors for controlling turn-on and turn-off of the corresponding transistors. An emission control signal supplied through the emission control line and a scan signal supplied through the scan line are gate control signals and may share common features. An emission control signal and a scan signal may be used interchangeably.

Figure 2:
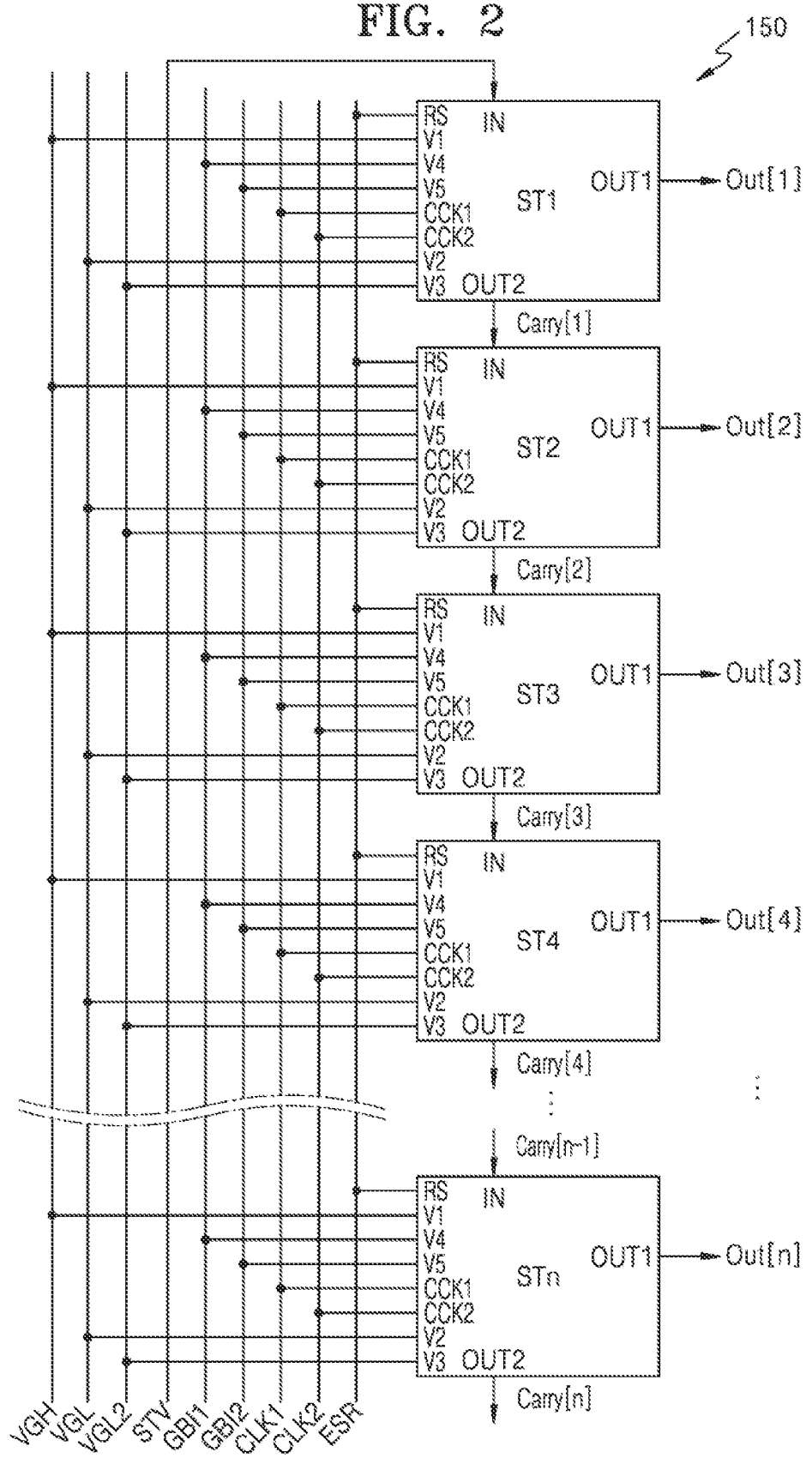
FIG. 2 is a diagram illustrating an emission control driver according to an embodiment.
Figure 3:
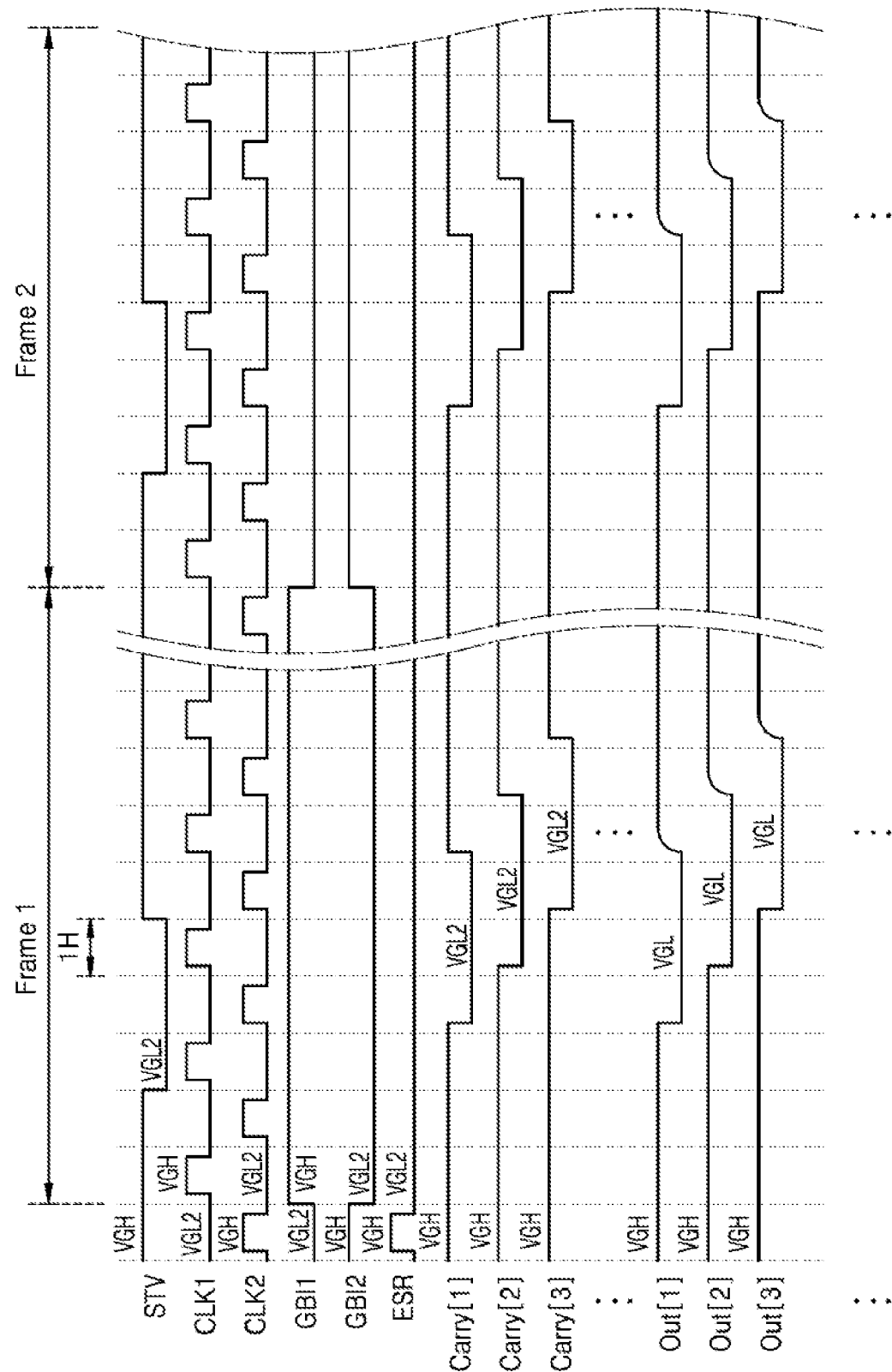
FIG. 3 is a diagram showing timings of signals associated with an emission control driver according to an embodiment.

FIG. 2 is a diagram illustrating the emission control driver 150 according to an embodiment. FIG. 3 is a diagram showing timings of signals of an emission control driver 150 according to an embodiment.

Referring to FIG. 2, the emission control driver 150 may include first to n-th stages ST1, ST2, ST3, ST4, to STn. The number of stages provided to the emission control driver 150 may depend on the number of pixel rows in the display part 110.

The stages ST1 to STn may respectively provide output signals Out[1], Out[2], Out[3], Out[4], ..., Out[n] in response to a start signal. The n-th stage STn may output an n-th output signal Out[n] to an n-th emission control line. An external signal STV, which is a start signal, may be supplied to the first stage ST1. The start signal may control timing of a first output signal Out[1], which is a first emission control signal. An on-voltage level may denote a high level, and an off-voltage level may denote a low level.

Each of the stages ST1 to STn may include an input terminal IN, a first clock terminal CCK1, a second clock terminal CCK2, a first power input terminal V1, a second power input terminal V2, a third power input terminal V3, a fourth power input terminal V4, a fifth power input terminal V5, a reset terminal RS, a first output terminal OUT1, and a second output terminal OUT2.

The input terminal IN may receive, as a start signal, an external signal STV or a previous carry signal. The external signal STV may be applied to the input terminal IN of the first stage ST1, and a carry signal output from a previous stage may be applied to the input terminal IN of each of the second to n-th stages ST2 to STn. An (n−1)st carry signal Carry[n−1] (e.g., Carry[3]) may be output from the (n−1)st stage STn−1 (e.g., ST3) and may be applied to an input terminal IN of the n-th stage STn (e.g., ST4). The length (i.e., the pulse width) of an off-voltage level of a start signal may be 3H and may be longer than each of the period of the first clock signal CLK1 and the period of the second clock signal CLK2.

Each first clock terminal CCK1 and each second clock terminal CCK2 may receive the first clock signal CLK1 or the second clock signal CLK2. As shown in FIG. 3, the first clock signal CLK1 and the second clock signal CLK2 may be square wave signals in which a first voltage VGH of a high level and a second voltage VGL of a low level are repeated. Each of the period of the first clock signal CLK1 and the period of the second clock signal CLK2 may be 2H and may include a sub-period of a high level and a sub-period of a low level. The first clock signal CLK1 and the second clock signal CLK2 may have the same waveform and may have a phase difference. The second clock signal CLK2 may be a delayed version of the first clock signal CLK1 with a preset phase shift/difference that is less than or equal to 1 horizontal period (1H). Pulses of the first clock signal CLK1 supplied through a first clock signal line and the second clock signal CLK2 supplied through a second clock signal line may not overlap with each other. The length (the pulse width) of an on-voltage level of each of the first clock signal CLK1 and the second clock signal CLK2 may be equal to 1H or less than 1H and may be preset.

The reset terminal RS may receive a reset signal ESR. The reset signal ESR may be a pulse supplied to the first to n-th stages ST1 to STn at a specific point of time. The reset signal ESR may have an on-voltage level of the first voltage VGH at a preset timing, and have a third voltage VGL2 of an off-voltage level at other timings. When power is applied to the display apparatus (i.e., when the display apparatus is powered on), the reset signal ESR may be supplied as the first voltage VGH to the first to n-th stages ST1 to STn for a preset time; when the preset time elapses, the reset signal ESR may be supplied as the third voltage VGL2 to the first to n-th stages ST1 to STn.

The first power input terminal V1 may receive the first voltage VGH. The second power input terminal V2 may receive the second voltage VGL. The third power input terminal V3 may receive the third voltage VGL2. The fourth power input terminal V4 may receive a fourth voltage GBI1. The fifth power input terminal V5 may receive a fifth voltage GBI2.

Referring to FIG. 3, the fourth voltage GBI1 and the fifth voltage GBI2 may include the first voltage VGH and the third voltage VGL2 that alternate at a preset interval (e.g., a frame, a multiple of a frame, or a fraction of a frame). In an odd-numbered frame, the fourth voltage GBI1 applied to each of the first to n-th stages ST1 to STn may be the first voltage VGH, and the fifth voltage GBI2 may be the third voltage VGL2. In an even-numbered frame, the fourth voltage GBI1 applied to each of the first to n-th stages ST1 to STn may be the third voltage VGL2, and the fifth voltage GBI2 may be the first voltage VGH. The fourth voltage GBI1 and the fifth voltage GBI2 may include the first voltage VGH and the third voltage VGL2 that alternate every q times a frame (q frames) or every 1/q of a frame (1/q frame), wherein q is a natural number of 2 or more. One frame (a frame section) may be a period for which a one-frame image is displayed.

The first voltage VGH, the second voltage VGL, and the third voltage VGL2 may be applied to all the stages ST1 to STn and may be supplied through/from the controller 190 shown in FIG. 1 and/or a power supply unit not shown.

An output signal from the first output terminal OUT1 may be a scan signal and/or an emission control signal. Output signals Out[1], Out[2], Out[3], Out[4], ..., and Out[n] output from the first output terminals OUT1 of two consecutive ones of the first to n-th stages ST1 to STn may be shifted by a 1 horizontal time 1H. Each output signal may be supplied to a pixel through a corresponding output line, for example, a corresponding emission control line. The pulse width of each off-voltage pulse of the output signals Out[1], Out[2], Out[3], Out[4], ..., and Out[n] may be 3H and may be equal to the pulse width of the start signal.

The second output terminal OUT2 may output a carry signal. Carry signals Carry[1], Carry[2], Carry[3], Carry[4], ..., and Carry[n] output from the second output terminals OUT2 of two consecutive ones of the first to n-th stages ST1 to STn may be shifted by a 1 horizontal time 1H. The pulse width of each off-voltage pulse of the carry signals Carry[1], Carry[2], Carry[3], Carry[4], ..., and Carry[n] may be 3H and may be equal to the pulse width of the start signal.

The start of the off-voltage level of each of carry signals Carry[1], Carry[2], Carry[3], Carry[4], ..., and Carry[n] and each of output signals Out[1], Out[2], Out[3], Out[4], ..., and Out[n] start may be later by 1H than the start of the off-voltage level of the corresponding start signal.

Figure 4:
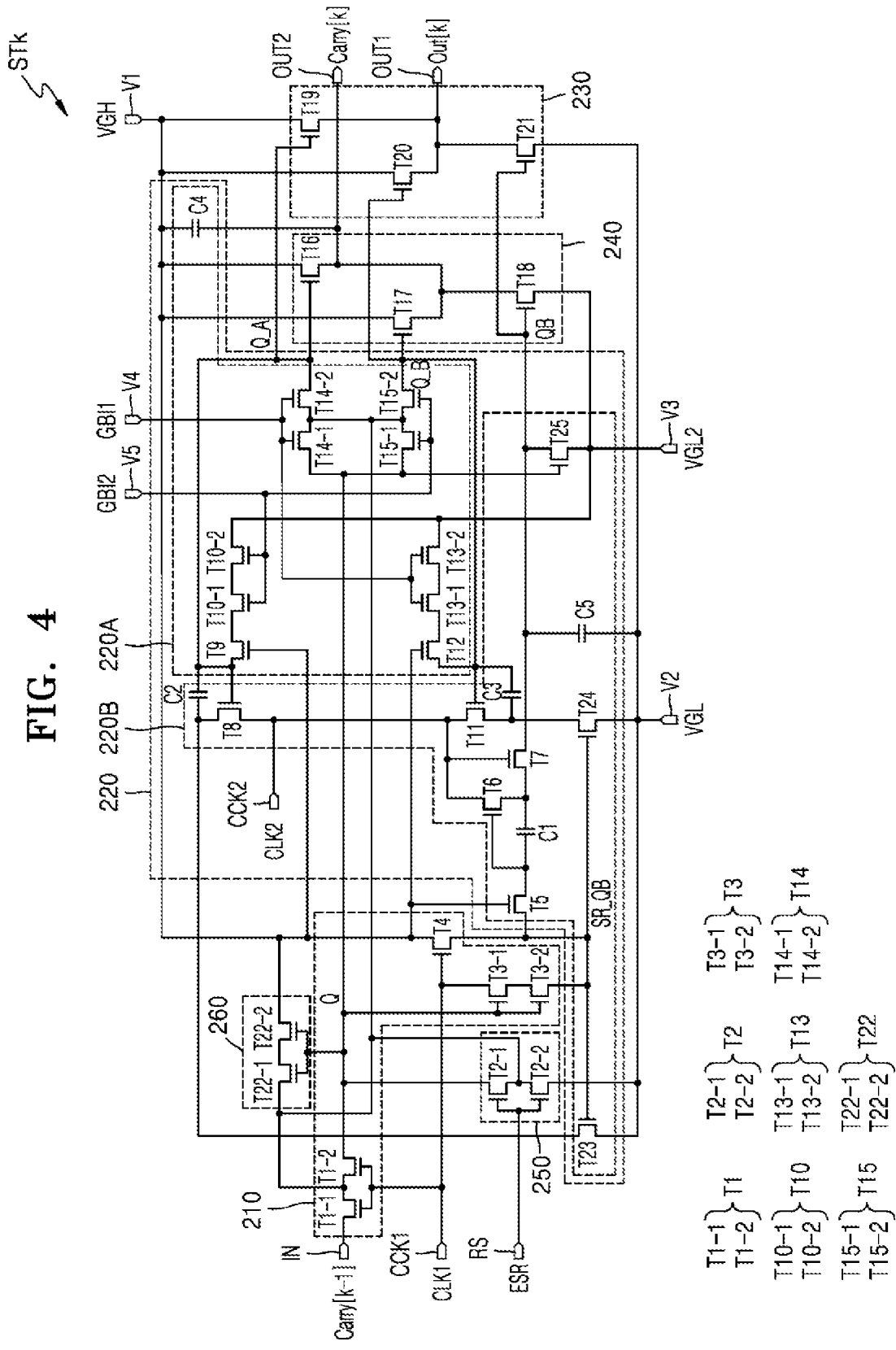
FIG. 4 is a circuit diagram of a stage included in the emission control driver of FIG. 2 according to an embodiment.

FIG. 4 is a circuit diagram of a stage STk included in the emission control driver 150 of FIG. 2 according to an embodiment.

A k-th stage STk (k is a natural number in the range of 1 to n) may include a first node controller 210 (or first controller 210), a second node controller 220 (or second controller 220), a first output unit 230, a second output unit 240, a reset unit 250, and a leakage controller 260.

In the k-th stage STk, a previous carry signal Carry[k−1] may be supplied to an input terminal IN, the first clock signal CLK1 may be supplied to the first clock terminal CCK1, the second clock signal CLK2 may be supplied to the second clock terminal CCK2, the first voltage VGH may be supplied to the first power input terminal V1, the second voltage VGL may be supplied to the second power input terminal V2, the third voltage VGL2 may be supplied to the third power input terminal V3, the fourth voltage GBI1 may be supplied to the fourth power input terminal V4, the fifth voltage GBI2 may be supplied to the fifth power input terminal V5, and the reset signal ESR may be supplied to the reset terminal RS. The external signal STV may be supplied as a start signal to the input terminal IN of the first stage when k=1.

The first node controller 210 may control the voltages of a first node Q and a fourth node SR_QB based on a previous carry signal Carry[k−1] and the first clock signal CLK1, the previous carry signal Carry[k−1] being a start signal supplied to the input terminal IN, and the first clock signal CLK1 being supplied to the first clock terminal CCK1. The first node controller 210 (or first controller 210) may include a first transistor T1, a third transistor T3, and a fourth transistor T4.

The term "transistor" may mean "transistor set." The term "(u-v)th transistor" may mean "u-th set v-th sub-transistor." The first transistor T1 (or first transistor set T1) may include a (1-1)st transistor T1-1 (or first-set first sub-transistor T1-1) and a (1-2)nd transistor T1-2 (or first-set second sub-transistor T1-2) connected in series between the input terminal IN and the first node Q. Gate terminals of the (1-1)st transistor T1-1 and the (1-2)nd transistor T1-2 may be connected to the first clock terminal CCK1. The first transistor T1 may be turned on when the first clock signal CLK1 is in a high level, and may control the voltage level of the first node Q according to a previous carry signal Carry[k−1].

The third transistor T3 may include a (3-1)st transistor T3-1 and a (3-2)nd transistor T3-2 connected in series between the first clock terminal CCK1 and the fourth node SR_QB. Gate terminals of the (3-1)st transistor T3-1 and the (3-2)nd transistor T3-2 may be connected to the first node Q. The third transistor T3 may be turned on when the first node Q is in a high-level state, and may control the voltage level of the fourth node SR_QB to a high level or a low level according to the first clock signal CLK1.

The fourth transistor T4 may be connected between the first power input terminal V1 and the fourth node SR_QB. A gate terminal of the fourth transistor T4 may be connected to the first clock terminal CCK1. The fourth transistor T4 may be turned on when the first clock signal CLK1 supplied to the first clock terminal CCK1 is in a high level, and may transfer the first voltage VGH supplied to the first power input terminal V1 to the fourth node SR_QB to control the fourth node SR_QB to a high level.

The second node controller 220 (or second controller 220) may control the voltages of a second node Q_A, a third node Q_B, and a fifth node QB based on the second clock signal CLK2 supplied to the second clock terminal CCK2, the fourth voltage GBI1 or the fifth voltage GBI2 supplied to the fourth power input terminal V4 or the fifth power input terminal V5. The second node controller 220 may include 5th to 15th transistors T5, T6, T7, T8, T9, T10, T11, T12, T13, T14, and T15; 23th to 25th transistors T23, T24, and T25; first to fifth capacitors C1, C2, C3, C4, and C5. The second node controller 220 may include a (2-1)st node controller 220A (or first sub-controller 220A) and a (2-2)nd node controller 220B (or second sub-controller 220B). The (2-1)st node controller 220A may selectively connect the first node Q to the second node Q_A or the third node Q_B. The (2-2)nd node controller 220B may control the fifth node QB to a voltage level in which the voltage level of the first node Q is inverted.

The (2-1)st node controller 220A may include the 9th transistor T9, the 10th transistor T10; the 12th to 15th transistors T12, T13, T14, and T15; and the fourth capacitor C4.

The 9th transistor T9 may be connected to between a second terminal of the second capacitor C2 (the second node Q_A) and the 10th transistor T10. A gate terminal of the 9th transistor T9 may be connected to the first power input terminal V1.

The 10th transistor T10 may include a (10-1)st transistor T10-1 and a (10-2)nd transistor T10-2 connected in series between the 9th transistor T9 and the third power input terminal V3. Gate terminals of the (10-1)st transistor T10-1 and the (10-2)nd transistor T10-2 may be connected to the fifth power input terminal V5.

The 12th transistor T12 may be connected between a second terminal of the third capacitor C3 (the third node Q_B) and the 13th transistor T13. A gate terminal of the 12th transistor T12 may be connected to the first power input terminal V1.

The 13th transistor T13 may include a (13-1)st transistor T13-1 and a (13-2)nd transistor T13-2 connected in series between the 12th transistor T12 and the third power input terminal V3. Gate terminals of the (13-1)st transistor T13-1 and the (13-2)nd transistor T13-2 may be connected to the fourth power input terminal V4.

The 14th transistor T14 may include a (14-1)st transistor T14-1 and a (14-2)nd transistor T14-2 connected in series between the first node Q and the second node Q_A. Gate terminals of the (14-1)st transistor T14-1 and the (14-2)nd transistor T14-2 may be connected to the fourth power input terminal V4. The 14th transistor T14 may be turned on/off according to the voltage of the fourth voltage GBI1 supplied to the fourth power input terminal V4. The 14th transistor T14 may be turned on to transfer the voltage of the first node Q to the second node Q_A.

The 15th transistor T15 may include a (15-1)st transistor T15-1 and a (15-2)nd transistor T15-2 connected in series between the first node Q and the third node Q_B. Gate terminals of the (15-1)st transistor T15-1 and the (15-2)nd transistor T15-2 may be connected to the fifth power input terminal V5. The 15th transistor T15 may be turned on/off according to the voltage of the fifth voltage GBI2 supplied to the fifth power input terminal V5. The 15th transistor T15 may be turned on to transfer the voltage of the first node Q to the third node Q_B.

The 12th transistor T12 may be turned on by the first voltage VGH of a high level input to the first power input terminal V1 when the second node Q_A is in a high level, the 13th transistor T13 may be turned on by the fourth voltage GBI1 of a high level input to the fourth power input terminal V4; accordingly, the third node Q_B may be in a low-level state by the third voltage VGL2 input to the third power input terminal V3. An inverse bias may be applied to the 10th transistor T10 by the fifth voltage GBI2 of a low level input to the fifth power input terminal V5; accordingly, the 10th transistor T10 may be turned off.

The 9th transistor T9 may be turned on by the first voltage VGH of a high level input to the first power input terminal V1 when the third node Q_B is in a high level, the 10th transistor T10 may be turned on by the fifth voltage GBI2 of a high level input to the fifth power input terminal V5; accordingly, the second node Q_A may be in a low-level state by the third voltage VGL2 input to the third power input terminal V3. In this case, an inverse bias may be applied to the 13th transistor T13 by the fourth voltage GBI1 of a low level input to the fourth power input terminal V4; accordingly, the 13th transistor T13 may be turned off.

The fourth capacitor C4 may be connected between the first power input terminal V1 and the second output terminal OUT2, and may be a boost capacitor that boosts the voltage of the second output terminal OUT2.

The (2-2)nd node controller (220B) may include the 5th to 8th transistors T5, T6, T7, and T8; the 11th transistor T11; the 23th to 25th transistors T23, T24, and T25; the first to third capacitors C1, C2, and C3; and the fifth capacitor C5.

The 5th transistor T5 may be connected between the fourth node SR_QB and the gate terminal of the sixth transistor T6 (the first terminal of the first capacitor C1). A gate terminal of the 5th transistor T5 may be connected to the first power input terminal V1.

The 6th transistor T6 may be connected between the second terminal of the first capacitor C1 and the second clock terminal CCK2. A gate terminal of the 6th transistor T6 may be connected to the first terminal of the first capacitor C1.

The 7th transistor T7 may be connected between the second terminal of the first capacitor C1 and the fifth node QB. A gate terminal of the 7th transistor T7 may be connected to the second clock terminal CCK2.

The first capacitor C1 may be connected between the 5th transistor T5 and the 7th transistor T7.

The 5th to 7th transistors T5, T6, and T7 may be turned on by the fourth node SR_QB of a high level when the first node Q is in a low level, and the second clock signal CLK2 of a high level; accordingly, the fifth node QB may be in a high-level state due to the second clock signal CLK2.

The 8th transistor T8 may be connected between the first terminal of the second capacitor C2 and the second clock terminal CCK2. A gate terminal of the 8th transistor T8 may be connected to the second terminal of the second capacitor C2 and the second node Q_A.

The second capacitor C2 may be connected between the 8th transistor T8 and the second node Q_A.

The 11th transistor T11 may be connected between the first terminal of the third capacitor C3 and the second clock terminal CCK2. A gate terminal of the 11th transistor T11 may be connected to the second terminal of the third capacitor C3 and the third node Q_B.

The third capacitor C3 may be connected between the 11th transistor T11 and the third node Q_B.

The 23rd transistor T23 may be connected between the first terminal of the second capacitor C2 and the second power input terminal V2. A gate terminal of the 23rd transistor T23 may be connected to the fourth node SR_QB.

The 24th transistor T24 may be connected between the first terminal of the third capacitor C3 and the second power input terminal V2. A gate terminal of the 24th transistor T24 may be connected to the fourth node SR_QB.

The 5th capacitor C5 may be connected between the 5th node QB and the second power input terminal V2 to hold the voltage of the fifth node QB.

The 25th transistor T25 may be connected between the fifth node QB and the third power input terminal V3. A gate terminal of the 25th transistor T25 may be connected to the first node Q. The 25th transistor T25 may be turned on to transfer the third voltage VGL2 to the fifth node QB.

The first output unit 230 may output an output signal Out[k] of a high level or a low level to the first output OUT1 according to the voltage levels of the second node Q_A, the third node Q_B, and the fifth node QB. The second output unit 240 may include the 19th transistor T19, the 20th transistor T20, and the 21st transistor T21.

The 19th transistor T19 may be a pull-up transistor and may be connected between the first power input terminal V1 and the first output terminal OUT1. A gate terminal of the 19th transistor T19 may be connected to the second node Q_A. The 19th transistor T19 may be turned on when the second node Q_A is in a high level to supply the first voltage VGH from the first power input terminal V1 to the first output terminal OUT1.

The 20th transistor T20 may be a pull-up-transistor and may be connected between the first power input terminal V1 and the first output terminal OUT1. A gate terminal of the 20th transistor T20 may be connected to the third node Q_B. The 20th transistor T20 may be turned on when the third node Q_B is in a high level to supply the first voltage VGH from the first power input terminal V1 to the first output terminal OUT1.

The 21st transistor T21 may be a pull-down transistor and may be connected between the first output terminal OUT1 and the second power input terminal V2. A gate terminal of the 21st transistor T21 may be connected to the fifth node QB. The 21th transistor T21 may be turned on when the fifth node QB is in a high level to supply the second voltage VGL from the second power input terminal V2 to the first output terminal OUT1.

The second output unit 240 may output a carry signal Carry[k] of a high level or a low level to the second output OUT2 according to the voltage level of the second node Q_A, the third node Q_B, and the fifth node QB. The second output unit 240 may include the 16th transistor T16, the 17th transistor T17, and the 18th transistor T18.

The 16th transistor T16 may be a pull-up-transistor and may be connected between the first power input terminal V1 and the second output terminal OUT2. A gate terminal of the 16th transistor T16 may be connected to the second node Q_A. The 16th transistor T16 may be turned on when the second node Q_A is in a high level to supply the first voltage VGH from the first power input terminal V1 to the second output terminal OUT2.

The 17th transistor T17 may be a pull-up-transistor and may be connected between the first power input terminal V1 and the second output terminal OUT2. A gate terminal of the 17th transistor T17 may be connected to the third node Q_B. The 17th transistor T17 may be turned on when the third node Q_B is in a high level to supply the first voltage VGH from the first power input terminal V1 to the second output terminal OUT2.

The 18th transistor T18 may be a pull-down transistor and may be connected between the second output terminal OUT2 and the third power input terminal V3. A gate terminal of the 18th transistor T18 may be connected to the fifth node QB. The 18th transistor T18 may be turned on when the fifth node QB is in a high level to supply the third voltage VGL2 from the third power input terminal V3 to the second output terminal OUT2.

The reset unit 250 may reset the first node Q based on a reset signal ESR supplied to the reset terminal RS. The reset unit 250 may include the second transistor T2. The second transistor T2 may include a (2-1)st transistor T2-1 and a (2-2)nd transistor T2-2 connected in series between the first node Q and the second power input terminal V2. Gate terminals of the (2-1)st transistor T2-1 and the (2-2)nd transistor T2-2 may be connected to the reset terminal RS. When a reset signal ESR as a high-level pulse is applied to the reset terminal RS, the second transistor T2 may be turned on to reset (initialize) the first node Q to the second voltage VGL.

When the first node Q is in an on-voltage level state, the leakage controller 260 may block a leakage current at the first node Q, which is connected to a drain/source terminal of each of the first transistor T1, the second transistor T2, the 14th transistor T14, and the 15th transistor T15. The leakage controller 260 may include the 22nd transistor T22. One end of the 22nd transistor T22 may be connected to the first power input terminal V1, and another end may be connected to an intermediate node (a common electrode) between the (1-1)st transistor T1-1 and the (1-2)nd transistor T1-2, an intermediate node (a common electrode) between the (2-1)st transistor T2-1 and the (2-2)nd transistor T2-2, an intermediate node (a common electrode) between the (14-1)st transistor T14-1 and the (14-2)nd transistor T14-2, and an intermediate node (a common electrode) between the (15-1)st transistor T15-1 and the (15-2)nd transistor T15-2. When the first node Q is in a high-level state, the 22th transistor T22 is turned on and may reduce the current leakage of the first node Q by maintaining the intermediate node of the first transistor T1, the second transistor T2, the 14th transistor T14, and the 15th transistor T15 at a high level.

Figure 5:
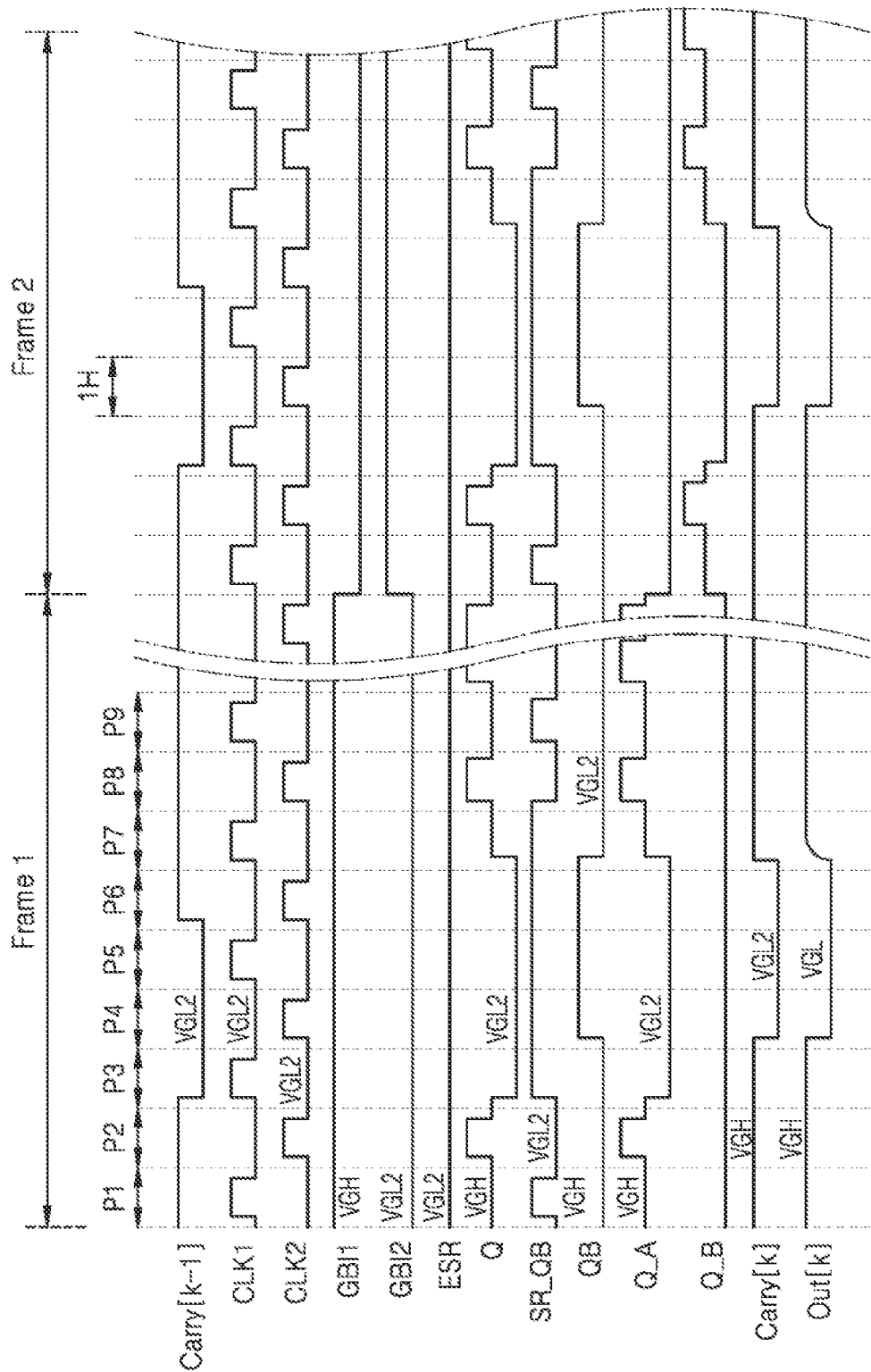
FIG. 5 is a waveform diagram illustrating signals associated with an operation of the stage of FIG. 4 according to an embodiment.

FIG. 5 is a waveform diagram illustrating signals associated with an operation of the stage of FIG. 4 according to an embodiment.

In FIG. 5, the width of each of first to ninth sections/periods P1, P2, P3, P4, P5, P6, P7, P8, and P9 may be 1H. FIG. 5 shows a previous carry signal Carry[k−1] (a start signal); the first clock signal CLK1; the second clock signal CLK2; the fourth voltage GBI1; the fifth voltage GBI2; the node voltages of the first to fifth nodes Q, Q_A, Q_B, SR_QB, and QB; a carry signal Carry[k]; and an output signal Out[k]. For convenience, an on-voltage level such as the voltage level of the first voltage VGH may be expressed as a high level, and an off-voltage level such as the voltage level of the second voltage VGL or the third voltage VGL2 may be expressed as a low level. FIG. 5 illustrates an operation of the stage during a first frame Frame1 and a second frame Frame2. The first frame Frame1 includes sections/periods P1 to P9.

In the first frame Frame1, during a first section P1, a previous carry signal Carry[k−1] input from a previous stage may be in a high level, the first clock signal CLK1 input to the first clock terminal CCK1 may be in a high level, and the second clock signal CLK2 input to the second clock terminal CCK2 may be in a low level.

The first transistor T1 may be turned on according to the first clock signal CLK1, such that the previous carry signal Carry[k−1] may be transferred to the first node Q; thus, the first node Q may be in a high-level state. Accordingly, the third transistor T3 may be turned on, such that the first clock signal CLK1 may be transferred to the fourth node SR_QB; thus, the fourth node SR_QB may be in a high-level state. The 25th transistor T25 whose gate terminal is connected to the first node Q is turned on, and the fifth node QB may be in a low-level state due to the third voltage VGL2 from the third power input terminal V3.

The 14th transistor T14 whose gate terminal is connected to the fourth power input terminal V4 is turned on, the first node Q is connected to the second node Q_A, and the second node Q_A may be in a high-level state. The 12th transistor T12 whose gate terminal is connected to the first power input terminal V1 is turned on, the 13th transistor T13 whose gate terminal is connected to the fourth power input terminal V4 is turned on; accordingly, the third node Q_B may be in a low-level state due to the third voltage VGL2 input from the third power input terminal V3. Accordingly, the 16th transistor T16 whose gate terminal is connected to the second node Q_A and the 19th transistor T19 are turned on, and the second output terminal OUT2 and the first output terminal OUT1 may respectively output a carry signal Carry[k] of a high level and an output signal Out[k] of a high level based on the first voltage VGH input from the first power input terminal V1.

During the second section P2, the first clock signal CLK1 input to the first clock terminal CCK1 may be in a low level, and the second clock signal CLK2 input to the second clock terminal CCK2 may be in a high level.

The first transistor T1 is turned off by the first clock signal CLK1; thus, the first node Q may be in a floated state. The first node Q and the second node Q_A may maintain a high-level state due to the second capacitor C2, which is a boost capacitor. The first node Q and the second node Q_A may maintain a voltage of a higher level than that in the first section P1 due to the second capacitor C2. Accordingly, the 16th transistor T16 and the 19th transistor T19 may maintain a turned-on state, such that a carry signal Carry[k] of a high level and an output signal Out[k] of a high level are respectively output.

The third transistor T3 may transfer the first clock signal CLK1 of a low level to the fourth node SR_QB; thus, the fourth node SR_QB may be in a low-level state.

During the third section P3, a previous carry signal Carry[k−1] may transition to a low level, the first clock signal CLK1 may be in a high level, and the second clock signal CLK2 may be in a low level.

The first transistor T1 may be turned on according to the first clock signal CLK1, such that the previous carry signal Carry[k−1] may be transferred to the first node Q; thus, the first node Q may be in a low-level state. Accordingly, the third transistor T3 is turned off, and the fourth transistor T4 is turned on; thus, the first voltage VGH from the first power input terminal V1 is transferred to the fourth node SR_QB. Accordingly, the fourth node SR_QB may be in a high-level state.

The second node Q_A may be in a low-level state given that the 14th transistor T14 is turned on. The third node Q_B may maintain a low-level state due to the 12th transistor T12 and the 13th transistor T13.

The 25th transistor T25 whose gate terminal is connected to the first node Q is turned off; thus, the fifth node QB may maintain a low-level state. Accordingly, the second output terminal OUT2 and the first output terminal OUT1 may respectively output a carry signal Carry[k] of a high level and an output signal Out[k] of a high level, as in the second section P2.

During the fourth section P4, the first clock signal CLK1 may be in a low level, and the second clock signal CLK2 may be in a high level.

The 7th transistor T7 is turned on according to the second clock signal CLK2, and the 5th transistor T5 whose gate terminal receives the first voltage VGH is turned on; thus, the 6th transistor T6 whose gate terminal is connected to the fourth node SR_QB is turned on, and the second clock signal CLK2 is transferred to the fifth node QB. Accordingly, the fifth node QB may be in a high-level state. Accordingly, the 18th transistor T18 and the 21st transistor T21 may be turned on. The second output terminal OUT2 may output, as the carry signal Carry[k], the third voltage VGL2 of a low level supplied from the third power input terminal V3 through the 18th transistor T18. The first output terminal OUT1 may output, as the output signal Out[k], the second voltage VGL of a low level supplied from the second power input terminal V2 through the 21st transistor T21.

During the fifth section P5, the first clock signal CLK1 may be in a high level, and the second clock signal CLK2 may be in a low level. The fifth node QB may maintain a high level due to the fifth capacitor C5, and the first output terminal OUT1 and the second output terminal OUT2 may respectively continue to output a carry signal Carry[k] of a low level and an output signal Out[k] of a low level.

During the sixth section P6, a previous carry signal Carry[k−1] may transition to a high level, the first clock signal CLK1 may be in a low level, and the second clock signal CLK2 may be in a high level.

The first transistor T1 is turned off due to the first clock signal CLK1, and the first node Q and the second node Q_A may maintain a low-level state. The 7th transistor T7 is turned on according to the second clock signal CLK2, and the 5th transistor T5 whose gate terminal receives the first voltage VGH is turned on; thus, the 6th transistor T6 whose gate terminal is connected to the fourth node SR_QB is turned on, and the second clock signal CLK2 is transferred to the fifth node QB. Accordingly, the fifth node QB may maintain a high-level state. Accordingly, the first output terminal OUT1 and the second output terminal OUT2 may respectively continue to output a carry signal Carry[k] of a low level and an output signal Out[k] of a low level.

During the 7th section P7, the first clock signal CLK1 may be in a high level, and the second clock signal CLK2 may be in a low level.

The first transistor T1 may be turned on according to the first clock signal CLK1, such that the previous carry signal Carry[k−1] may be transferred to the first node Q; thus, the first node Q may be in a high-level state. Accordingly, the third transistor T3 may be turned on, such that the first clock signal CLK1 may be transferred to the fourth node SR_QB; thus, the fourth node SR_QB may be in a high-level state. The 25th transistor T25 whose gate terminal is connected to the first node Q is turned on, and the fifth node QB may be in a low-level state due to the third voltage VGL2 from the third power input terminal V3.

The 14th transistor T14 whose gate terminal is connected to the fourth power input terminal V4 is turned on, the first node Q is connected to the second node Q_A, and the second node Q_A may be in a high-level state. The 12th transistor T12 whose gate terminal is connected to the first power input terminal V1 is turned on, and the 13th transistor T13 whose gate terminal is connected to the fourth power input terminal V4 is turned on; accordingly, the third node Q_B may be in a low-level state due to the third voltage VGL2 input from the third power input terminal V3. Accordingly, the 16th transistor T16 and the 19th transistor T19 whose gate terminals are connected to the second node Q_A are turned on, and the second output terminal OUT2 and the first output terminal OUT1 may respectively output a carry signal Carry[k] of a high level and an output signal Out[k] of a high level based on the first voltage VGH input from the first power input terminal V1.

An operation of the stage STk during the 8th section P8 may be substantially the same as an operation of the stage STk during the second section P2, and an operation of the stage STk during the 9th section P9 may be substantially the same as an operation of the stage STk during the 7th section P7.

During a second frame Frame2 (or a second frame section), among signals input to the stage STk, the fourth voltage GBI1 is changed to a low level, the 5th voltage GBL2 is changed to a high level, and the voltage levels of the other signals are the same as the voltage levels of signals input to the stage STk during the first frame Frame1.

Accordingly, the voltage levels of the second node Q_A and the third node Q_B may respectively be the voltage levels of the third node Q_B and the second node Q_A during the first frame Frame1. The second output terminals OUT2 and the first output terminals OUT1 may respectively output a carry signal Carry[k] of a high level and an output signal Out[k] of a high level due to the turned-on states of the 17th transistor T17 and the 20th transistor T20 whose gate terminals are connected to the third node Q_B.

If a single transistor is used to output a carry signal Carry[k] of a high level and an output signal Out[k] of a high level, a threshold voltage shift may occur due to long time on-bias of the transistor. In an embodiment, because the voltage levels of the fourth voltage GBI1 and the 5th voltage GBI2 are changed on a frame basis, the 16th transistor T16 and the 17th transistor T17 may be turned on and turned off in turns on a frame basis, and the 19th transistor T19 and the 20th transistor T20 may be turned on and turned off in turns on a frame basis. Advantageously, unwanted changes in the threshold voltages of the 16th transistor T16, the 17th transistor T17, the 19th transistor T19, and the 20th transistor T20 may be reduced or prevented.

Each of FIGS. 6 to 12 is a circuit diagram of a stage circuit of an emission control driver according to an embodiment.

Figure 6:
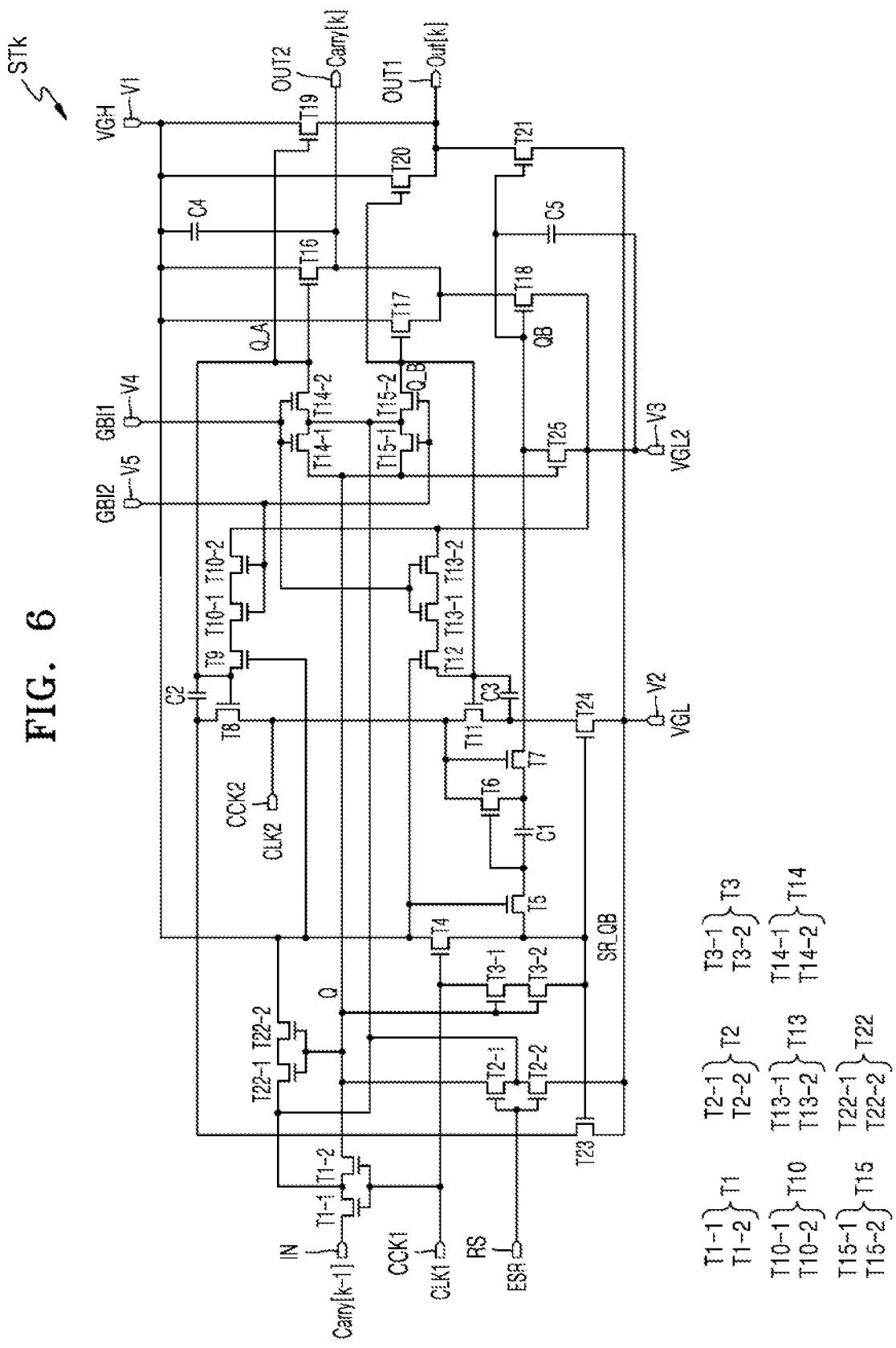
FIG. 6 is a circuit diagram of a stage of an emission control driver according to an embodiment.

The stage STk shown in FIG. 6 is different from the stage STk shown in FIG. 4 in that the 5th capacitor C5 is connected between the fifth node QB and the third power input terminal V3. The other configuration and operations are substantially the same.

Figure 7:
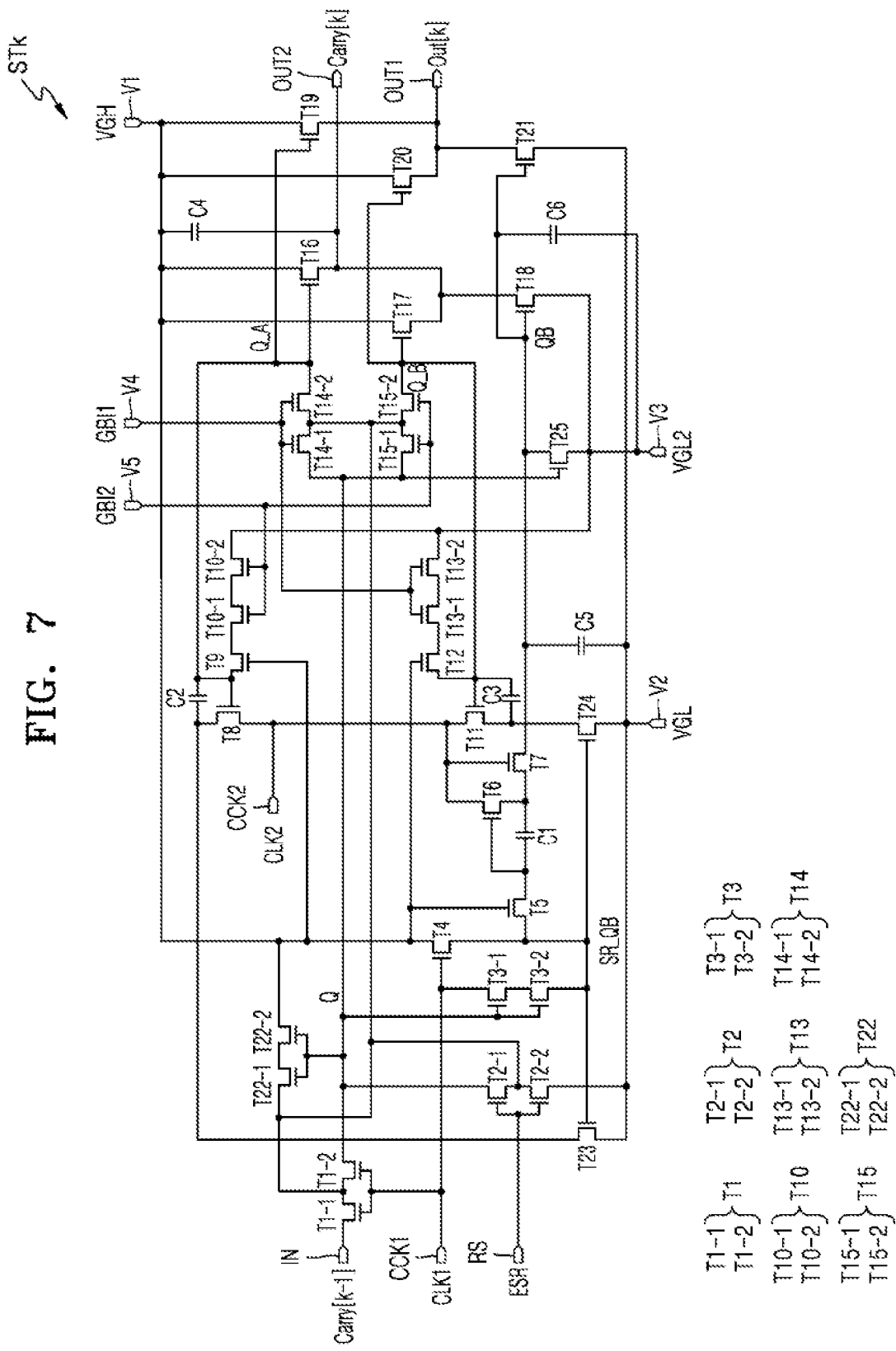
FIG. 7 is a circuit diagram of a stage of an emission control driver according to an embodiment.

The stage STk shown in FIG. 7 is different from the stage STk shown in FIG. 4 in that a sixth capacitor C6 is additionally connected between the fifth node QB and the third power input terminal V3. The other configuration and operations are substantially the same.

Figure 8:
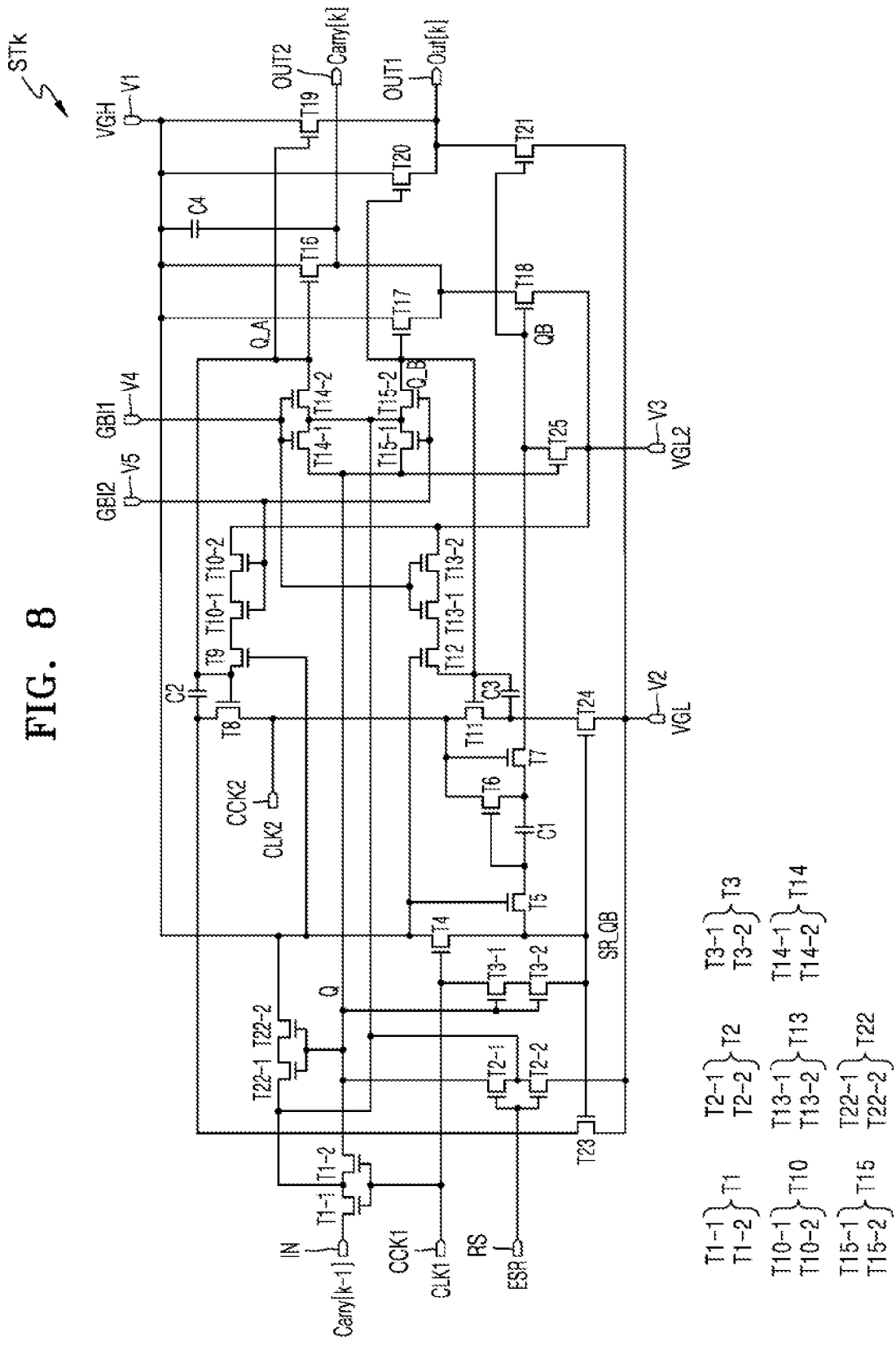
FIG. 8 is a circuit diagram of a stage of an emission control driver according to an embodiment.

The stage STk shown in FIG. 8 is different from the stage STk shown in FIG. 4 in that the fifth capacitor C5 is removed. The other configuration and operations are substantially the same.

Figure 9:
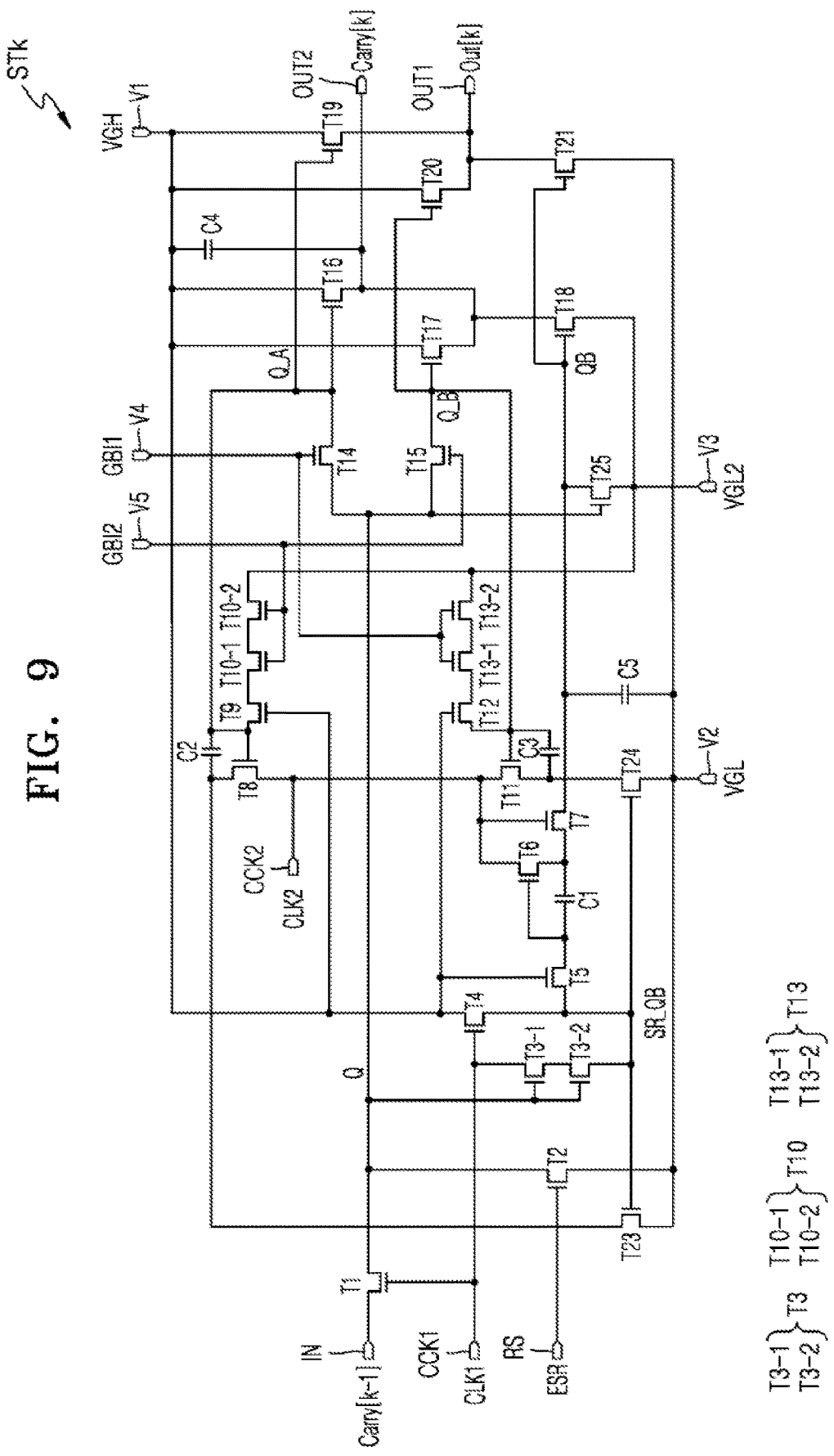
FIG. 9 is a circuit diagram of a stage of an emission control driver according to an embodiment.

The stage STk shown in FIG. 9 is different from the stage STk shown in FIG. 4 in that the (1-2)nd transistor T1-2, the (2-2)nd transistor T2-2, the (14-2)nd transistor T14-2, and the (15-2)nd transistor T15-2 are replaced with the first transistor T1, the second transistor T2, the 14th transistor T14, and the 15th transistor T15 having a single-transistor structure, and in that the (22-1)st transistor T22-1 and the (22-2)nd transistor T22-2 are removed. The other configuration and operations are substantially the same.

Figure 10:
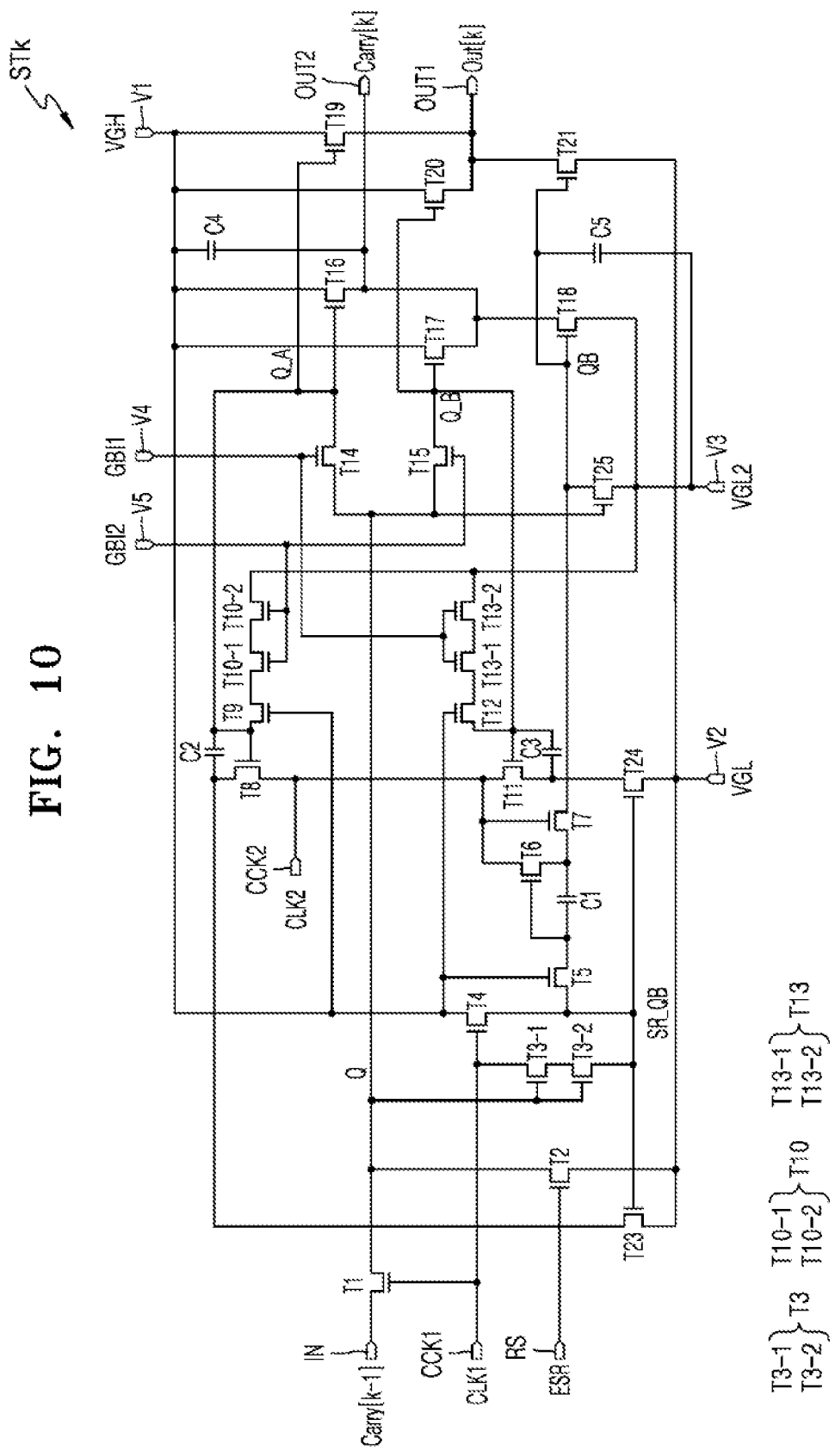
FIG. 10 is a circuit diagram of a stage of an emission control driver according to an embodiment.

The stage STk shown in FIG. 10 is different from the stage STK shown in FIG. 9 in that the 5th capacitor C5 is connected between the fifth node QB and the third power input terminal V3. The other configuration and operations are substantially the same.

Figure 11:
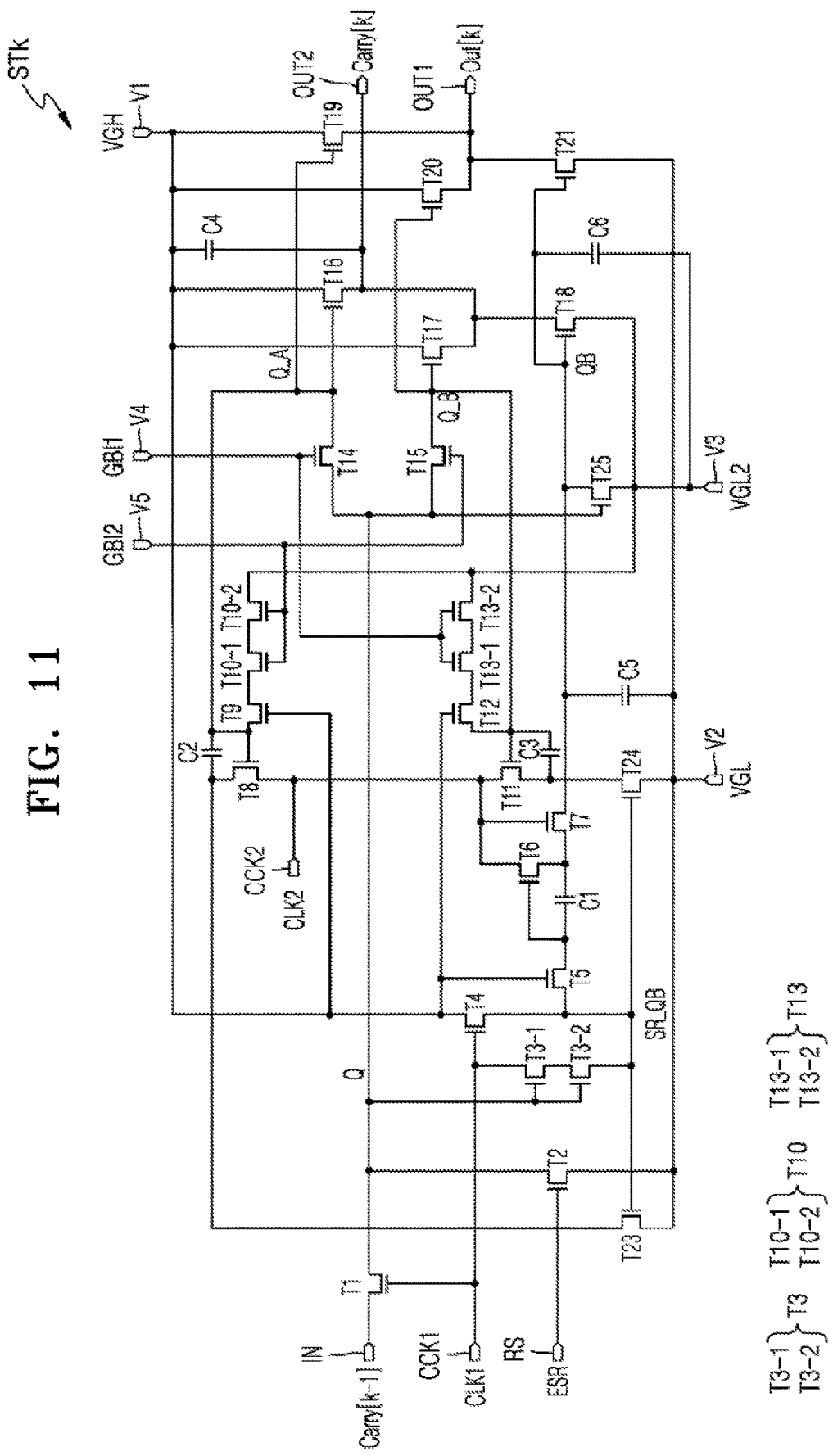
FIG. 11 is a circuit diagram of a stage of an emission control driver according to an embodiment.

The stage STk shown in FIG. 11 is different from the stage STk shown in FIG. 9 in that the sixth capacitor C6 is additionally connected between the fifth node QB and the third power input terminal V3. The other configuration and operations are substantially the same.

Figure 12:
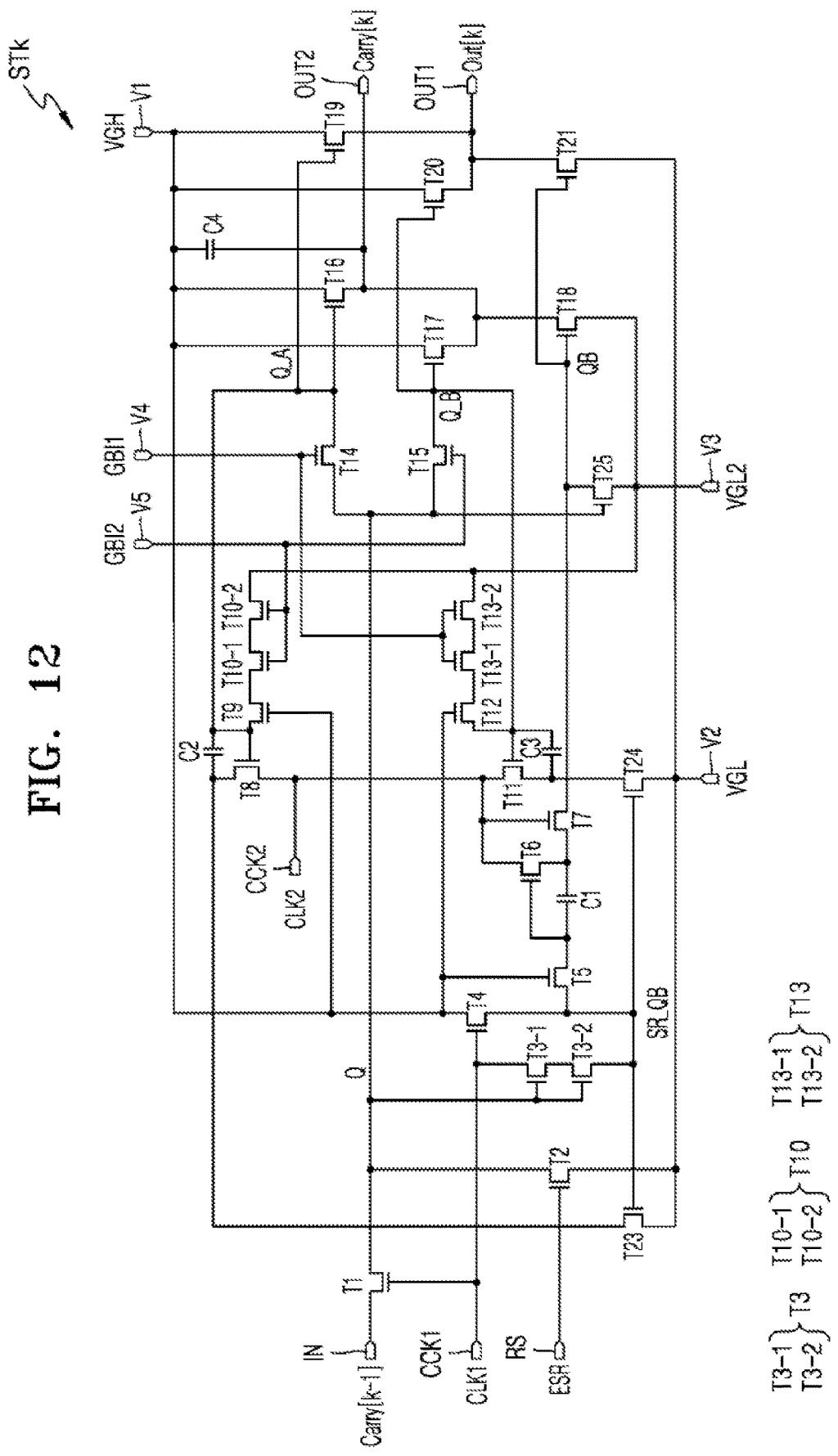
FIG. 12 is a circuit diagram of a stage of an emission control driver according to an embodiment.

The stage shown in FIG. 12 is different from the stage shown in FIG. 9 in that the fifth capacitor C5 is removed. The other configuration and operations are substantially the same.

The emission control driver may include N-type transistors. The emission control driver may compensate for characteristic deterioration of the transistors (which may be caused by bias stress), or may mitigate a leakage current increase (which may be caused by a high temperature), and may generate an emission control signal having an on-voltage of a sufficiently high level.

A display apparatus including the emission control driver may be an organic light-emitting display apparatus, an inorganic light-emitting display apparatus, or a quantum-dot light-emitting display apparatus.

According to embodiments, an emission control driver that may stably output emission control signals. According to embodiments, a display apparatus including the emission control driver may display images with satisfactory quality.

The described embodiments should be considered in an illustrative sense and not for purposes of limitation. Descriptions of features or aspects within each embodiment should typically be considered as available for other similar features or aspects in other embodiments. While embodiments have been described with reference to the figures, various changes in form and details may be made in the described embodiments without departing from the scope defined by the following claims.

What is claimed is:

1. A driver that provides a gate control signal to a pixel of a display apparatus, the driver comprising a stage, the stage comprising:
   an input terminal configured to receive a start signal;
   a first power input terminal configured to receive a first voltage of an on-voltage level;
   a second power input terminal configured to receive a second voltage of an off-voltage level;
   a first clock terminal configured to receive a first clock signal;
   a second clock terminal configured to receive a second clock signal;
   a first controller configured to control a voltage level of a first node based on the start signal and the first clock signal;
   a second controller configured to control each of voltage levels of a second node and a third node;
   a first output terminal; and
   a first output unit configured to output the gate control signal to the first output terminal, the first output unit comprising a first pull-up transistor and a second pull-up transistor, a gate terminal of the first pull-up transistor being connected to the second node, a gate terminal of the second pull-up transistor being connected to the third node,
   wherein the first output unit is configured to output the gate control signal having the first voltage to the first output terminal through the first pull-up transistor when the second node is in an on-voltage level state, and the first output unit is configured to output the gate control signal having the first voltage to the first output terminal through the second pull-up transistor when the third node is in the on-voltage level state.

2. The driver of claim 1, wherein the stage further comprises:
   a third power input terminal configured to receive a third voltage of the off-voltage level;
   a second output terminal; and
   a second output unit configured to output a carry signal having the first voltage through the second output terminal, one of the second node and the third node is in the on-voltage level state, and wherein the third voltage is less than the second voltage.

3. The driver of claim 2, wherein the second output unit comprises:
   a third pull-up transistor connected between the first power input terminal and the second output terminal,
   wherein a gate terminal of the third pull-up transistor is connected to the second node;
   a fourth pull-up transistor connected between the first power input terminal and the second output terminal, wherein a gate terminal of the fourth pull-up transistor is connected to the third node; and
   a second pull-down transistor connected between the third power input terminal and the second output terminal, wherein a gate terminal of the second pull-down transistor is connected to a fifth node, and
   wherein the second output unit configured to output the carry signal having the third voltage to the second output terminal through the second pull-down transistor when the fifth node is in the on-voltage level state.

4. The driver of claim 1, wherein the stage receives the start signal from a device external to the driver or from a previous stage included in the driver.

5. The driver of claim 1,
   the first pull-up transistor connected between the first output terminal and the first power input terminal, and
   the second pull-up transistor connected between the first output terminal and the first power input terminal, and
   wherein the first output unit further comprises
   a first pull-down transistor connected between the first output terminal and the second power input terminal, a gate terminal of the first pull-down transistor being connected to a fifth node, and
   wherein the first output unit further configured to output the gate control signal having the second voltage to the first output terminal through the first pull-down transistor when the fifth node is in an on-voltage level state.

6. The driver of claim 1, wherein the second clock signal is a phase-shifted version of the first clock signal, and wherein a phase difference between the first clock signal and the second clock signal is preset.

7. The driver of claim 1, wherein a length of an off-voltage level of the start signal is longer than each of a period of the first clock signal and a period the second clock signal.

8. The driver of claim 1, wherein a start of an off-voltage level period of the gate control signal is delayed by a preset time from a start of an off-voltage level period of the start signal.

9. The driver of claim 8, wherein a length of the off-voltage level period of the gate control signal is equal to a length of the off-voltage level period of the start signal.

10. The driver of claim 1, wherein the first controller comprises:
    a first transistor connected between the input terminal and the first node, wherein a gate terminal of the first transistor is connected to the first clock terminal;
    a third transistor connected between the first clock terminal and a fourth node, wherein a gate terminal of the third transistor is connected to the first node; and
    a fourth transistor connected between the first power input terminal and the fourth node, wherein a gate terminal of the fourth transistor is connected to the first clock terminal.

11. The driver of claim 10, wherein the first transistor comprises a first sub transistor and a second sub transistor which are connected to each other in series, and
    wherein the stage further comprises a 22nd transistor connected between the first power input terminal and an intermediate node of the first sub transistor and the second sub transistor of the first transistor, a gate terminal of the 22nd transistor being connected to the first node.

12. The driver of claim 1, wherein the second controller comprises:
a first sub-controller configured to control the voltage level of the second node or the third node to be equal to the voltage level of the first node with an interval of a multiple or fraction of a frame; and
a second sub-controller configured to control a voltage level of a fifth node to be equal to an opposite voltage level of the voltage level of the first node.

13. The driver of claim 12, wherein the stage further comprises:
a second output terminal configured to output a carry signal;
a third power input terminal configured to receive a third voltage less than the second voltage;
a fourth power input terminal configured to receive a fourth voltage; and
a fifth power input terminal configured to receive a fifth voltage, a voltage level of the fifth voltage being an opposite voltage level of a voltage level of the fourth voltage,
wherein the first sub-controller comprises:
a 14th transistor connected between the first node and the second node, wherein a gate terminal of the 14th transistor is connected to the fourth power input terminal;
a 15th transistor connected between the first node and the third node, wherein a gate terminal of the 15th transistor is connected to the fifth power input terminal;
a 12th transistor connected between the third node and a 13th transistor, wherein a gate terminal of the 12th transistor is connected to the first power input terminal;
the 13th transistor connected between the 12th transistor and the third power input terminal, wherein a gate terminal of the 13th transistor is connected to the fourth power input terminal;
a 9th transistor connected between the second node and a 10th transistor, wherein a gate terminal of the 9th transistor is connected to the first power input terminal;
the 10th transistor connected between the 9th transistor and the third power input terminal, wherein a gate terminal of the 10th transistor is connected to the fifth power input terminal; and
a boost capacitor connected between the first power input terminal and the second output terminal.

14. The driver of claim 13, wherein each of the 14th transistor and the 15th transistor comprises a first sub transistor and a second sub transistor which are connected to each other in series, and
wherein the stage further comprises a 22nd transistor connected between the first power input terminal and intermediate nodes of the first sub transistor and the second sub transistor of each of the 14th transistor and the 15th transistor, a gate terminal of the 22nd transistor being connected to the first node.

15. The driver of claim 12, wherein the stage further comprises:

a third power input terminal configured to receive a third voltage less than the second voltage; and
wherein the second sub-controller comprises:
a 5th transistor connected between a fourth node and a first terminal of a first capacitor, wherein a gate terminal of the 5th transistor is connected to the first power input terminal;
a 6th transistor connected between a second terminal of the first capacitor and the second clock terminal, wherein a gate terminal of the 6th transistor is connected to the first terminal of the first capacitor;
a 7th transistor connected between a second terminal of the first capacitor and the fifth node, wherein a gate terminal of the 7th transistor is connected to the second clock terminal;
an 8th transistor connected between the second clock terminal and a first terminal of a second capacitor, wherein a gate terminal of the 8th transistor is connected to a second terminal of the second capacitor and the second node;
an 11th transistor connected between the second clock terminal and a first terminal of a third capacitor, wherein a gate terminal of the 11th transistor is connected to a second terminal of the third capacitor and the third node;
a 23rd transistor connected between the first terminal of the second capacitor and the second power input terminal, wherein a gate terminal of the 23rd transistor is connected to a fourth node;
a 24th transistor connected between the first terminal of the third capacitor and the second power input terminal, wherein a gate terminal of the 24th transistor is connected to the fourth node; and
a 25th transistor connected between the fifth node and the third power input terminal, wherein a gate terminal of the 25th transistor is connected to the first node.

16. The driver of claim 15, wherein the stage further comprises a fifth capacitor connected between the fifth node and the third power input terminal.

17. The driver of claim 16, wherein the stage further comprises a sixth capacitor connected between the fifth node and the second power input terminal.

18. The driver of claim 15, wherein the stage further comprises a fifth capacitor connected between the fifth node and the second power input terminal.

19. The driver of claim 1, wherein the stage further comprises:
a reset terminal configured to receive a reset signal; and
a second transistor connected between the first node and the second power input terminal, wherein a gate terminal of the second transistor is connected to the reset terminal.

20. The driver of claim 1, wherein the second node and the third node sequentially enter the on-voltage level state based on a multiple or fraction of a frame.

* * * * *